US011088167B2

(12) United States Patent
Wang et al.

(10) Patent No.: US 11,088,167 B2
(45) Date of Patent: Aug. 10, 2021

(54) TRANSISTOR, THREE DIMENSIONAL MEMORY DEVICE INCLUDING SUCH TRANSISTOR AND METHOD OF FABRICATING SUCH MEMORY DEVICE

(71) Applicant: Chen-Chih Wang, Taipei (TW)

(72) Inventors: Chen-Chih Wang, Taipei (TW); Li-Wei Ho, Taipei (TW); Yeu-Yang Wang, Taipei (TW)

(73) Assignee: Chen-Chih Wang, Taipei (TW)

( * ) Notice: Subject to any disclaimer, the term of this patent is extended or adjusted under 35 U.S.C. 154(b) by 35 days.

(21) Appl. No.: 16/740,091

(22) Filed: Jan. 10, 2020

(65) Prior Publication Data

US 2020/0273882 A1 Aug. 27, 2020

Related U.S. Application Data

(60) Provisional application No. 62/811,257, filed on Feb. 27, 2019.

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/02532* (2013.01); *H01L 21/30604* (2013.01);
(Continued)

(58) Field of Classification Search
CPC ......... H01L 27/11582; H01L 29/40114; H01L 29/40117; H01L 11/02532;
(Continued)

(56) References Cited

U.S. PATENT DOCUMENTS 10,600,802 B2 * 3/2020 Nakamura ........ H01L 29/40117
2017/0229472 A1 * 8/2017 Lu ....................... H01L 21/3003
(Continued)

*Primary Examiner* — Zandra V Smith
*Assistant Examiner* — Andre C Stevenson
(74) *Attorney, Agent, or Firm* — Muncy, Geissler, Olds & Lowe, P.C.

(57) ABSTRACT

The invention discloses a transistor, a three dimensional memory device including such transistors and a method of fabricating such memory device. The transistor according to the invention includes a pillar of a semiconductor material, extending in a normal direction of a semiconductor substrate, a gate dielectric layer and a gate conductor. The pillar of the semiconductor material has a base side face parallel to the normal direction, a tapered side face opposite to the base side face, a top face perpendicular to the normal direction, a bottom face opposite to the top face, a front side face adjacent to the base side face and the tapered side face, and a rear side face opposite to the front side face. A first elongated portion, sandwiched among the base side face, the front side face, the bottom face and the top face, forms a source region. A second elongated portion, sandwiched among the base side face, the rear side face, the bottom face and the top face, forms a drain region. A plate portion, on the base side face and between the first elongated portion and the second elongated portion, forms a channel region. Other portion of the pillar forms a body region. The gate dielectric layer is formed to overlay the base side face of the pillar of the semiconductor material. The gate conductor is formed to overlay the gate dielectric layer.

11 Claims, 31 Drawing Sheets

(51) Int. Cl.
    *H01L 29/10*      (2006.01)
    *H01L 29/08*      (2006.01)
    *H01L 29/51*      (2006.01)
    *H01L 23/528*     (2006.01)
    *H01L 21/311*     (2006.01)
    *H01L 21/762*     (2006.01)
    *H01L 21/02*      (2006.01)
    *H01L 21/28*      (2006.01)
    *H01L 21/3213*    (2006.01)
    *H01L 21/306*     (2006.01)

(52) U.S. Cl.
    CPC .. *H01L 21/31111* (2013.01); *H01L 21/32133* (2013.01); *H01L 21/76224* (2013.01); *H01L 23/528* (2013.01); *H01L 27/11556* (2013.01); *H01L 29/0847* (2013.01); *H01L 29/1037* (2013.01); *H01L 29/40114* (2019.08); *H01L 29/40117* (2019.08); *H01L 29/513* (2013.01)

(58) Field of Classification Search
    CPC .......... H01L 21/30604; H01L 21/3111; H01L 21/32133; H01L 23/528; H01L 27/11556; H01L 29/0847; H01L 29/1037; H01L 29/513
    See application file for complete search history.

(56) References Cited

U.S. PATENT DOCUMENTS

2018/0198364 A1\* 7/2018 Chen ............... H02M 3/3376
2019/0123060 A1   4/2019 Wang \* cited by examiner

TRANSISTOR, THREE DIMENSIONAL MEMORY DEVICE INCLUDING SUCH TRANSISTOR AND METHOD OF FABRICATING SUCH MEMORY DEVICE

CROSS-REFERENCE TO RELATED APPLICATION

This utility application claims priorities to U.S. Provisional Application Ser. No. 62/811257, filed Feb. 27, 2019, which is incorporated herein by reference in its entirety.

BACKGROUND OF THE INVENTION

1. Field of the Invention

The invention relates to a transistor, a three dimensional memory device including such transistors and a method of fabricating such memory device, and more in particular, to a novel transistor, a three dimensional memory device including such transistors and a method of fabricating such memory device.

2. Description of the Prior Art

Referring to FIG. 1 and FIG. 2, those drawings schematically illustrate a vertical current type fan-shaped field effect transistor (FanFET) 1 disclosed by U.S. patent publication no. 2019123060A1. FIG. 1 is a perspective view of the vertical current type FanFET 1. FIG. 2 is a cross-sectional schematic drawing of the vertical current type FanFET 1 taken along the A-A line of FIG. 1.

As shown in FIG. 1 and FIG. 2, the vertical current type FanFET 1 includes a pillar 10 of a semiconductor material, extending in a transverse direction T of a semiconductor substrate (not shown in FIGS. 1 and 2), a gate dielectric layer 12 and a gate conductor 14. The semiconductor substrate also defines a normal direction N and a longitudinal direction L as shown in FIG. 1.

The pillar 10 of a semiconductor material has a base side face 100 perpendicular to the transverse direction T, a tapered side face 101 opposite to the base side face 100, a top face 102 parallel to the transverse direction T, a bottom face 103 opposite to the top face 102, a front side face 104 adjacent to the base side face 100 and the tapered side face 101, and a rear side face 105 opposite to the front side face 104. A first elongated portion 106, sandwiched among the base side face 100, the front side face 104, the top face 102 and the rear side face 105, forms a source region. A second elongated portion 107, sandwiched among the base side face 100, the front side face 104, the rear side face 105 and the bottom face 103, forms a drain region. A plate portion 108 on the base side face 100 and between the first elongated portion 106 and the second elongated portion 107 forms a channel region. Other portion of the pillar 10 forms a body region. The gate dielectric layer 12 is formed to overlay the base side face 100 of the pillar 10 of the semiconductor material. The gate conductor 14 is formed to overlay the gate dielectric layer 12.

Obviously, in the vertical current type FanFET 1, the pillar 10 of the semiconductor material extends in the transverse direction T of the semiconductor substrate, and the first elongated portion 106 of the source region and the second elongated portion 107 of the drain region are oppositely arranged up and down in the pillar 10 of the semiconductor material. Moreover, a three dimensional memory device, also disclosed by US patent publication no. 2019123060A1 and constituted by such vertical current type FanFETs 1, can enhance cell density thereof. But, current flows in a vertical direction of the three dimensional memory device constituted by such vertical current type FanFETs 1.

However, three dimensional memory devices, which need horizontal current flow, cannot utilize the vertical current type FanFETs.

SUMMARY OF THE INVENTION

Accordingly, one scope of the invention is to provide a novel transistor, a three dimensional memory device including such transistors and a method of fabricating such memory device. In particular, the transistor according to the invention is a horizontal current type FanFET different from the vertical current type FanFET of the prior art.

A transistor, named horizontal current type FanFET, according to a preferred embodiment of the invention includes a pillar of a semiconductor material, extending in a normal direction of a semiconductor substrate, a gate dielectric layer and a gate conductor. The pillar of the semiconductor material has a base side face parallel to the normal direction, a tapered side face opposite to the base side face, a first top face perpendicular to the normal direction, a bottom face opposite to the first top face, a front side face adjacent to the base side face and the tapered side face, and a rear side face opposite to the front side face. A first elongated portion, sandwiched among the base side face, the front side face, the bottom face and the first top face, forms a source region. A second elongated portion, sandwiched among the base side face, the rear side face, the bottom face and the first top face, forms a drain region. A plate portion, on the base side face and between the first elongated portion and the second elongated portion, forms a channel region. Other portion of the pillar forms a body region. The gate dielectric layer is formed to overlay the base side face of the pillar of the semiconductor material. The gate conductor is formed to overlay the gate dielectric layer.

In one embodiment, the base side face can be planar, convex or concave.

In one embodiment, a combination of the first top face of the pillar of the semiconductor material, a second top face of the gate dielectric layer and a third top face of the gate conductor can exhibit a semi-ellipse, a semi-circle, a triangle, a finger-like shape or a trapezoid.

A three dimensional memory device according to a preferred embodiment of the invention includes a plurality of spaced memory cell layers and a plurality of select gate line conductors. The plurality of spaced memory cell layers are formed on a semiconductor substrate defining a normal direction and a longitudinal direction. Each memory cell layer defines a plurality of columns and a plurality of rows, and includes a plurality of first isolation stripes extending in the longitudinal direction, a plurality of second isolation stripes extending in the longitudinal direction, a plurality of first select transistors, a plurality of second select transistors, a plurality of memory cells, a plurality of bit line conductors, and a plurality of word line conductors. The first isolation stripes and the second isolation stripes are alternatingly arranged. Each first isolation stripe has a respective first longitudinal edge and a respective second longitudinal edge. Each second isolation stripe has a respective third longitudinal edge and a respective fourth longitudinal edge. A plurality of recesses are formed between the first isolation stripes and the second isolation stripes, and face the third longitudinal side walls or the fourth longitudinal side walls of the second isolation stripes. The recesses at one side of each first isolation stripe and the recesses at the other side of said one first isolation stripe are staggeredly arranged. Each recess corresponds to one of the columns and to one of the rows. The plurality of first select transistors are arranged in at least two first end rows among the plurality of rows. The plurality of second select transistors are arranged in at least two second end rows among the plurality of rows. The plurality of memory cells are arranged in the rows between the first select transistors and the second select transistors. Each of the first select transistors, the second select transistors and the memory cells corresponds to one of the recesses and includes a pillar of a semiconductor material. Each pillar of the semiconductor material is fitted in the corresponding recess, extends in the normal direction, and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. A respective first elongated portion, sandwiched among the base side face, the front side face, the bottom face and the first top face, forms a respective source region. A respective second elongated portion, sandwiched among the base side face, the rear side face, the bottom face and the first top face, forms a respective drain region. A respective plate portion, on the base side face and between the first elongated portion and the second elongated portion, forms a respective channel region. Other portion of the pillar forms a respective body region. Each of the first select transistors and the second select transistors also includes a respective first gate oxide film overlaying the base side face of the corresponding pillar of the semiconductor material, a respective second gate oxide film overlaying the first gate oxide film, and a respective select gate conductor overlaying the second gate oxide film. Each memory cell also includes the respective second gate oxide film overlaying the base side face of the corresponding pillar of the semiconductor material, a respective gate dielectric multi-layered film overlaying the second gate oxide film, and the respective memory gate conductor overlaying the gate dielectric multi-layered film. Each of the bit line conductors corresponds to one of the columns and connects the pillars of the semiconductor material of the first select transistors, the second select transistors and the memory cells along the corresponding column. The word line conductors extend in the normal direction. Each word line conductor connects the vertically aligned memory gate conductors of the memory cells of the spaced memory cell layers. The select gate line conductors extend in the normal direction. Each select gate line conductor connects the vertically aligned select gate conductors of the first select transistors or the second select transistors of the spaced memory cell layers. Each word line conductor and each select gate line conductor are embedded in the adjacent second isolation stripe.

On theory, each memory cell layer can have an area density equal to or less than 2 times a square of a process feature size, per cell.

A method, according to a preferred embodiment of the invention, of fabrication a three dimensional memory device, firstly, is to form a plurality of semiconductor layers and a plurality of spacing insulating layers on a semiconductor substrate defining a normal direction and a longitudinal direction. The semiconductor layers and the spacing insulating layers are alternately arranged. The plurality of semiconductor layers define a plurality of spaced active layers. Next, the method according to the invention is to form a plurality of first trenches parallel to the longitudinal direction and being through the semiconductor layers and the spacing insulating layers. Each first trench has a respective first longitudinal side wall, a respective second longitudinal side wall and a plurality of protrusions protruding inwardly. The protrusions on the first longitudinal side wall and the protrusions on the second longitudinal side wall are staggeredly arranged. Then, the method according to the invention is to form a plurality of first isolation stripes which each is filled in one of the first trenches such that a plurality of stacked stripes of the semiconductor layers and the spacing insulating layers and the first isolation stripes are alternately arranged. Subsequently, the method according to the invention is to form a plurality of second trenches parallel to the longitudinal direction. Each second trench is formed on a portion of one of the stacked stripes and through the semiconductor layers and the spacing insulating layers, and has a respective third longitudinal side wall and a respective fourth longitudinal side wall. Afterward, the method according to the invention is to remove a plurality of first retained portions of the semiconductor layers, which each corresponds to one of the protrusions, such that a plurality of recesses are formed on the third longitudinal side wall and the fourth longitudinal side wall at each active layer. The recesses at one side of each first isolation stripe and the recesses at the other side of said one first isolation stripe are staggeredly arranged. Next, the method according to the invention is to form a plurality of pillars of a semiconductor material and a plurality of bit line conductors. The pillars of the semiconductor material at each active layer are arranged in a plurality of columns and a plurality of rows. Each pillar of the semiconductor material is fitted in one of the recesses, and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. A respective first elongated portion, sandwiched among the base side face, the front side face, the bottom face and the first top face, forms a respective source region. A respective second elongated portion, sandwiched among the base side face, the rear side face, the bottom face and the first top face, forms a respective drain region. A respective plate portion, on the base side face and between the first elongated portion and the second elongated portion, forms a respective channel region. Other portion of the pillar of the semiconductor material forms a respective body region. Each bit line conductor corresponds to one of the columns and connects the pillars along the corresponding column. Then, the method according to the invention is to form a plurality of first gate oxide films which each overlays the base side face of one of the pillars of the semiconductor material arranged in at least two first end rows and at least two second end rows among the plurality of rows. Subsequently, the method according to the invention is to form a plurality of second gate oxide films which each overlays the base side face of one of the pillars of the semiconductor material arranged in the rows between the at least two first end rows and the at least two second end rows or one of the first gate oxide films. Afterward, the method according to the invention is to form a plurality of gate dielectric multi-layered films which each overlays one of the second gate oxide films overlaying the base side faces of the pillars of the semiconductor material arranged in the rows between the at least two first end rows and the at least two second end rows. Next, the method according to the invention is to form a plurality of conductor layers which each overlays one of the third longitudinal side wall and the fourth longitudinal side wall of one of the second trenches. Then, the method according to the invention is to partially etch the conductor layers to form a plurality of memory gate conductors, a plurality of word line conductors, a plurality of select gate conductors and a plurality of select gate line conductors. Each select gate conductor overlays one of the second gate oxide films. Each memory gate conductor overlays one of the gate dielectric multi-layered films. Each word line conductor extends in the normal direction, and connects the vertically aligned memory gate conductors arranged in the rows between the at least two first end rows and the at least two second end rows at all of the active layers. Each select gate line conductor extends in the normal direction, and connects the vertically aligned select gate conductors arranged in the at least two first end rows and the at least two second end rows at all of the active layers. Finally, the method according to the invention is to form a plurality of second isolation stripes which each is filled in one of the second trenches.

Distinguishable from the prior art, in the horizontal current type FanFET according to the invention, the pillar of the semiconductor material extends in the normal direction of the semiconductor substrate, and the first elongated portion of the source region and the second elongated portion of the drain region are oppositely arranged front and rear in the pillar of the semiconductor material. Moreover, the three dimensional memory device, constituted by a plurality of horizontal current type FanFETs according to the invention, can enhance cell density thereof, and has horizontal current flow.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
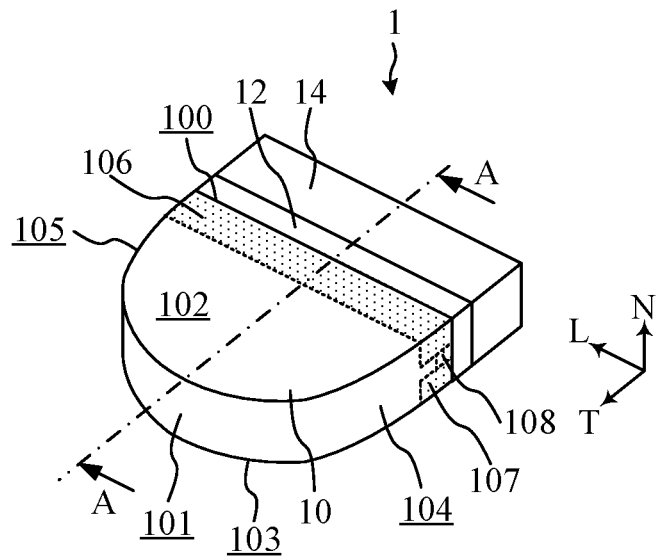
FIG. 1 is a perspective view of a vertical current type FanFET of the prior art.
Figure 2:
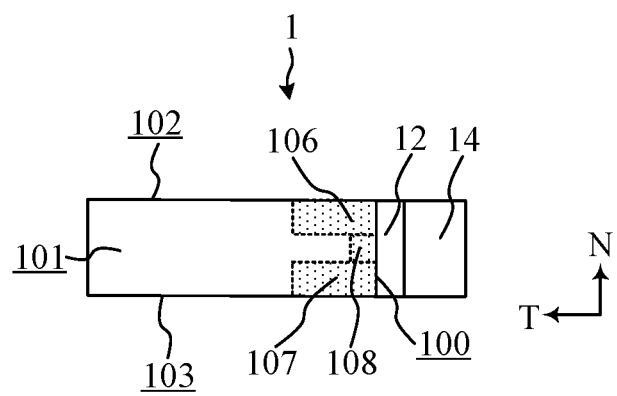
FIG. 2 is a cross-sectional view of the vertical current type FanFET taken along the A-A line of FIG. 1.
Figure 3:
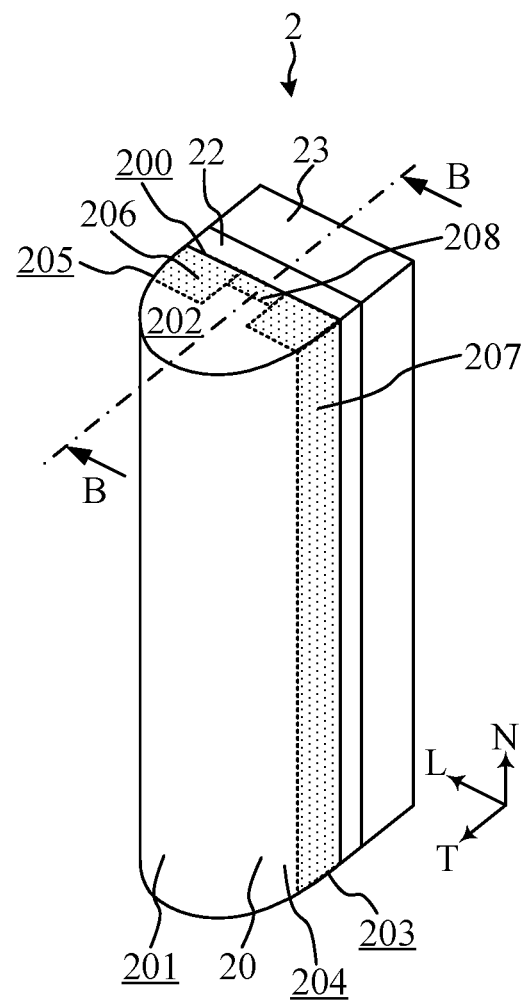
FIG. 3 is a top view of a transistor according to a preferred embodiment of the invention.
Figure 4:
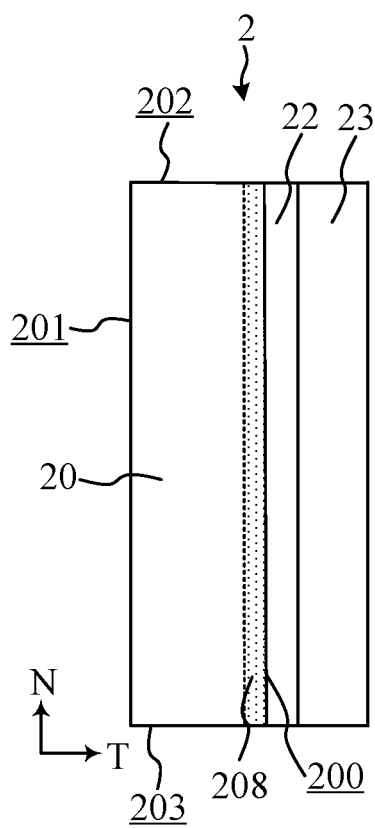
FIG. 4 is a cross-sectional view of the transistor taken along the B-B line of FIG. 3.

Referring to FIG. 3 and FIG. 4, those drawings schematically illustrate a transistor 2 according to a preferred embodiment of the invention. FIG. 3 is a perspective view of the transistor 2. FIG. 4 is a cross-sectional view of the transistor 2 taken along the B-B line of FIG. 3.

As shown in FIG. 3 and FIG. 4, the transistor 2, named horizontal current type FanFET, according to the preferred embodiment of the invention includes a pillar 20 of a semiconductor material, extending in a normal direction N of a semiconductor substrate (not shown in FIGS. 3 and 4), a gate dielectric layer 22 and a gate conductor 23.

The pillar 20 of the semiconductor material has a base side face 200 parallel to the normal direction N, a tapered side face 201 opposite to the base side face 200, a first top face 202 perpendicular to the normal direction N, a bottom face 203 opposite to the first top face 202, a front side face 204 adjacent to the base side face 200 and the tapered side face 201, and a rear side face 205 opposite to the front side face 204. A first elongated portion 206, sandwiched among the base side face 200, the front side face 204, the bottom face 203 and the first top face 202, forms a source region. A second elongated portion 207, sandwiched among the base side face 200, the rear side face 205, the bottom face 203 and the first top face 202, forms a drain region. A plate portion 208, on the base side face 200 and between the first elongated portion 206 and the second elongated portion 207, forms a channel region. Other portion of the pillar 20 forms a body region.

In one embodiment, the semiconductor material can be polysilicon or silicon single crystal. The first elongated portion 206 of the source region and the second elongated portion 207 of the drain region can be doped with an n-type dopant (e.g., phosphorus or arsenic) or a p-type dopant (e.g., boron). The plate portion 208 of the channel region can be doped with a dopant of a different conductivity from the source region and the drain region.

The gate dielectric layer 22 is formed to overlay the base side face 200 of the pillar 20 of the semiconductor material. The gate conductor 23 is formed to overlay the gate dielectric layer 22.

The gate dielectric layer 22 can be a single-layered structure or a multi-layered structure. For example, in one embodiment, the gate dielectric layer 22 is a single oxide layer. In another embodiment, the gate dielectric layer 22 is a two-layered film made of an oxide layer (referred to a tunnel oxide layer in some embodiments) and a nitride layer between the oxide layer and the gate conductor 23. In some embodiments, the gate dielectric layer 22 is a high-k dielectric layer or a combination with a multi-layered film. For example, the gate dielectric layer 22 may include one layer of metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$, $LaAlO_3$, and the like.

In one embodiment, the gate conductor 23 can be made of a conductive material, such as doped polysilicon, tantalum nitride, Ta, MoN, other conductive nitride, tungsten, other metal or combinations thereof. For example, the gate conductor 23 can be made of Ta.

Obviously, distinguishable from the vertical current type FanFET of the prior art, in the transistor 2 according to the invention, named horizontal current type FanFET, the pillar 20 of the semiconductor material extends in the normal direction N of the semiconductor substrate, and the first elongated portion 206 of the source region and the second elongated portion 207 of the drain region are oppositely arranged front and rear in the pillar 20 of the semiconductor material. With different biases, current flows from the first elongated portion 206 of the source region to the second elongated portion 207 of the drain region, alternatively, current flows from the second elongated portion 207 of the drain region to the first elongated portion 206 of the source region.

In one embodiment, the base side face 200 can be planar, convex or concave. In FIG. 3 and FIG.4, the base side face 200 is planar.

In one embodiment, a combination of the first top face 202 of the pillar 20 of the semiconductor material, a second top face of the gate dielectric layer 22 and a third top face of the gate conductor 23 can exhibit a semi-ellipse as shown in FIG. 3, a semi-circle, a triangle, a finger-like shape or a trapezoid.

In practical application, the transistor 2 according to the invention can be applied as a memory cell or a logic unit.

Figure 5:
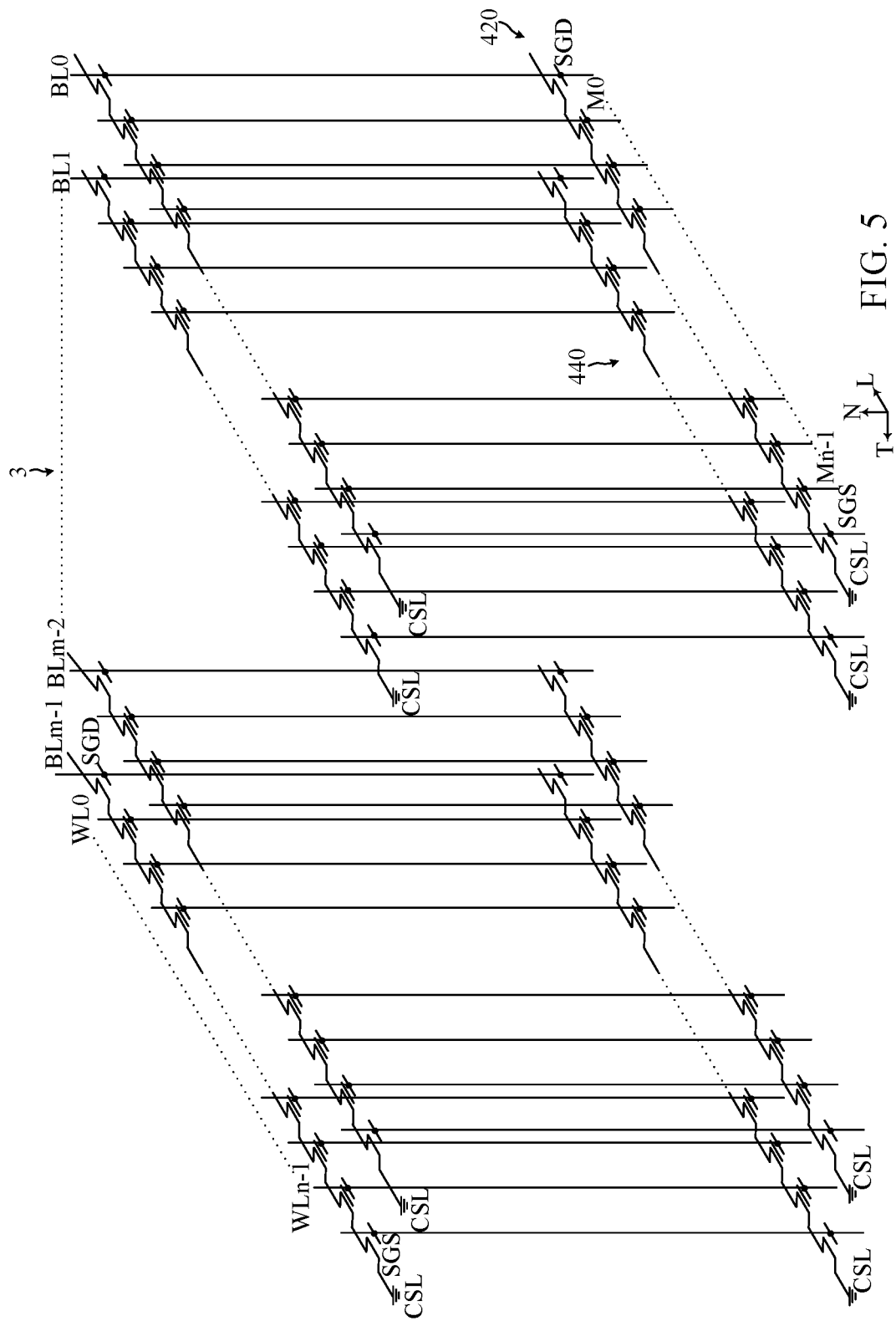
FIG. 5 is an equivalent circuit diagram of a memory cell array of a three dimensional memory device according to a preferred embodiment of the invention.
Figure 6:
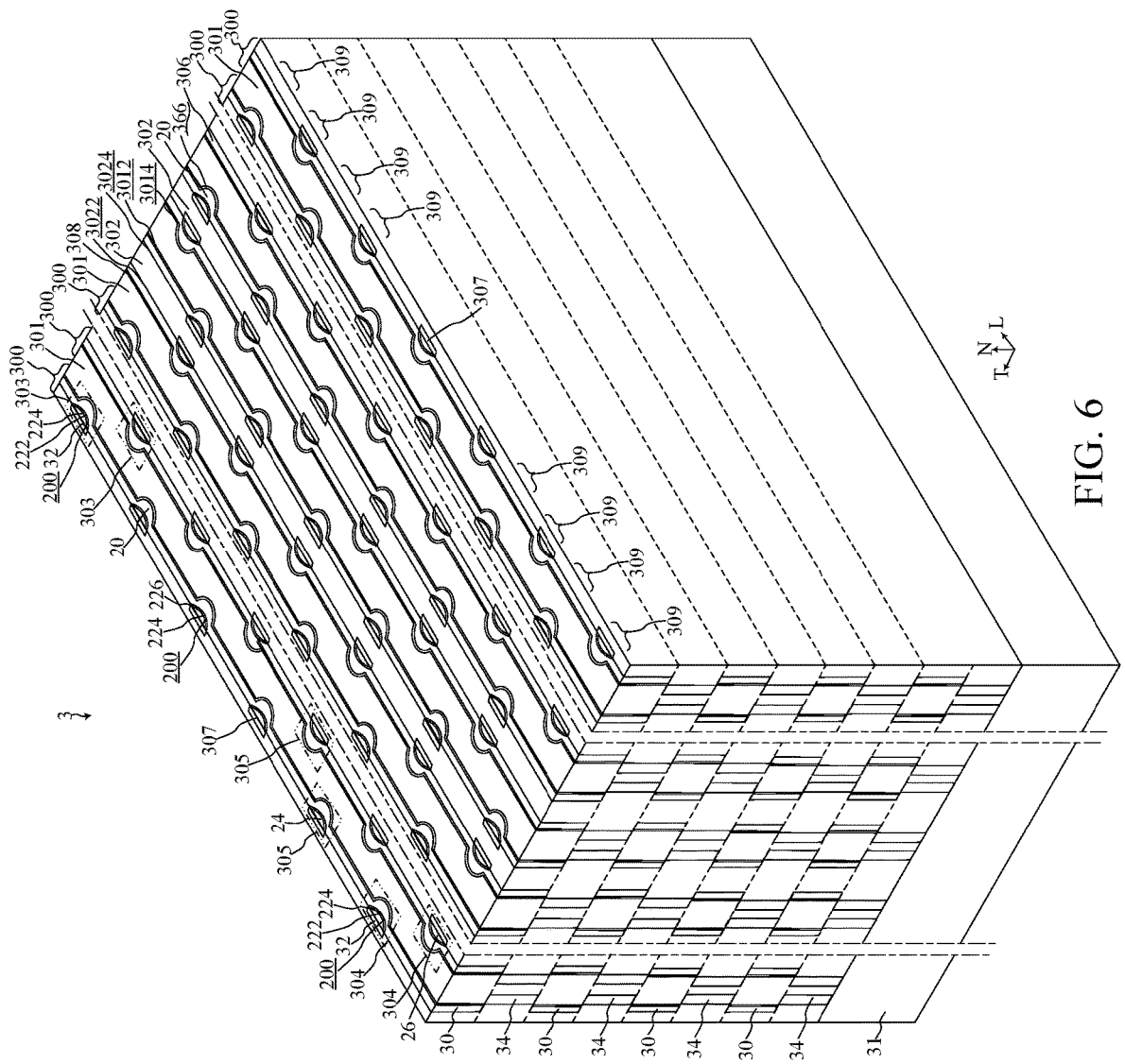
FIG. 6 is a perspective view of a three dimensional memory device according to a preferred embodiment of the invention.

Referring to FIG. 5 and FIG. 6, FIG. 5 is an equivalent circuit diagram of a three dimensional memory device 3 according to a preferred embodiment of the invention. In greater detail, FIG. 5 is an equivalent circuit diagram of a 3D-NAND flash memory device having a vertical gate (VG) structure. FIG. 6 is a perspective view schematically illustrate the three dimensional memory device 3 according to a preferred embodiment of the invention. The three dimensional memory device 3 according to the invention is mainly constituted by a plurality of transistor 2 according to the invention as shown in FIG. 3 and FIG. 4.

As shown in FIG. 5, the three dimensional memory device 3 according to the invention includes a plurality of memory cell strings 420 in the longitudinal direction L. The plurality of memory cell strings 420 may constitute a memory cell block 440 which is connected to a plurality of word lines W0 to Wn-1. Each of the memory cell strings 420 may include a string selection transistor SGD, a plurality of memory cells M0 to Mn-1, and a ground selection transistor SGS. The string selection transistor SGD, the plurality of memory cells M0 to Mn-1, and the ground selection transistor SGS may be disposed in series in the L direction by a plurality of bit lines B0 to Bm-1. The plurality of word lines W0 to Wn-1 may be respectively connected to the plurality of memory cells M0 to Mn-1, so as to control the respective memory cells M0 to Mn-1. The number of memory cells M0 to Mn-1 may be adjusted according to the capacity of the three dimensional memory device 3.

The plurality of bit lines B0 to Bm-1 extending in the longitudinal direction L may be connected to a top side of the memory cell strings 420 at the first column to the mth column, for example, to a drain of the string selection transistor SGD. Moreover, a common source line CSL may be connected to a bottom side of the memory cell strings 420, for example, to a source of ground selection transistor SGS. In some embodiments, each memory cell string 420 may include a plurality of memory cells (for example, from 4 memory cells to 8192 memory cells). The above number of the memory cells is only exemplary, not used to limit the claimed scope.

A word line extending in the normal direction N may be connected in common to gate electrodes of memory cells arranged in the same layer (for example, the memory cells arranged in the same layer as M0), among the memory cells M0 to Mn-1 of the memory cell strings 420. According to the driving of the word lines W0 to Wn-1, data may be programmed/read or erased into/from the memory cells M0 to Mn-1.

The string selection transistor SGD may be disposed between the bit line (for example, B0) and the uppermost memory cell M0 in each memory cell string 420. Each string selection transistor SGD in the memory cell block 440 may control data transmission between the bit lines B0 to Bm-1 and the memory cells M0 to Mn-1 by the common source line CSL connected to the gate of the ground selection transistor SGS.

The ground selection transistor SGS may be disposed between the lowermost memory cell Mn-1 and the common source line CSL. Each ground selection transistor SGS in the memory cell block 440 may control data transmission between the common source line CSL and the memory cells M0 to Mn-1 by a common source line connected to a gate of the ground selection transistor SGS.

As shown in FIG. 6, the three dimensional memory device 3 according to the invention includes a plurality of spaced memory cell layers 30 and a plurality of select gate line conductors 32. The plurality of spaced memory cell layers 30 are formed on a semiconductor substrate 31 defining a normal direction N, a longitudinal direction L and a transverse direction T. In FIG. 6, the plurality of spaced memory cell layers 30 and a plurality of spacing insulating layers 34 are alternately arranged on the semiconductor substrate 31.

Each memory cell layer 30 defines a plurality of columns 300 and a plurality of rows 309, and includes a plurality of first isolation stripes 301 extending in the longitudinal direction L, a plurality of second isolation stripes 302 extending in the longitudinal direction L, a plurality of first select transistors 303, a plurality of second select transistors 304, a plurality of memory cells 305, a plurality of bit line conductors 306, and a plurality of word line conductors 307. The first isolation stripes 301 and the second isolation stripes 302 are alternatingly arranged.

Each first isolation stripe 301 has a respective first longitudinal edge 3012 and a respective second longitudinal edge 3014. Each second isolation stripe 302 has a respective third longitudinal edge 3022 and a respective fourth longitudinal edge 3024. A plurality of recesses 366 are formed between the first isolation stripes 301 and the second isolation stripes 302, and face the third longitudinal side walls 3022 or the fourth longitudinal side walls 3024 of the second isolation stripes 302. In particular, the recesses 366 at one side of each first isolation stripe 301 and the recesses 366 at the other side of said one first isolation stripe 301 are staggeredly arranged. Each recess 366 corresponds to one of the columns 300 and to one of the rows 309.

Further, also as shown in FIG. 6, at each memory cell layer 30, the respective first longitudinal edge 3012 and the respective second longitudinal edge 3014 of each first isolation stripe 301 are respectively coated by an insulating liner film 308.

The plurality of first select transistors 303 are arranged in at least two first end rows 309 among the plurality of rows 309. The plurality of second select transistors 304 are arranged in at least two second end rows 309 among the plurality of rows 309. The plurality of memory cells 305 are arranged in the rows 309 between the first select transistors 303 and the second select transistors 304. Each of the first select transistors 303, the second select transistors 304 and the memory cells 305 corresponds to one of the recesses 366 and includes a pillar 20 of a semiconductor material. The first select transistors 303 are the string selection transistors SGD, and the second select transistors 304 are the ground selection transistors SGS.

Also, referring FIG. 3 and FIG. 4, each pillar 20 of the semiconductor material is fitted in the corresponding recess 366, extends in the normal direction N, and has a respective base side face 200 parallel to the normal direction N, a respective tapered side face 201 opposite to the base side face 200, a respective first top face 202 perpendicular to the normal direction N, a respective bottom face 203 opposite to the first top face 202, a respective front side face 204 adjacent to the base side face 200 and the tapered side face 201, and a respective rear side face 205 opposite to the front side face 204. A respective first elongated portion 206, sandwiched among the base side face 200, the front side face 204, the bottom face 203 and the first top face 202, forms a respective source region. A respective second elongated portion 207, sandwiched among the base side face 200, the rear side face 205, the bottom face 203 and the first top face 202, forms a respective drain region. A respective plate portion 208, on the base side face 200 and between the first elongated portion 206 and the second elongated portion 207, forms a respective channel region. Other portion of the pillar 20 forms a respective body region. In FIG. 6, the base side face 200 is concave.

In some embodiments, the semiconductor material forming the pillar 20 can be, for example, polysilicon. The source region and the drain region can be doped with an n-type dopant (e.g., phosphorus or arsenic) or a p-type dopant (e.g., boron). The channel region can be doped with a dopant of a different conductivity from the source region and the drain region. A portion of the body region that is away from the channel region, the source region and the drain region can be optionally doped with the specific dopant.

Figure 7A:
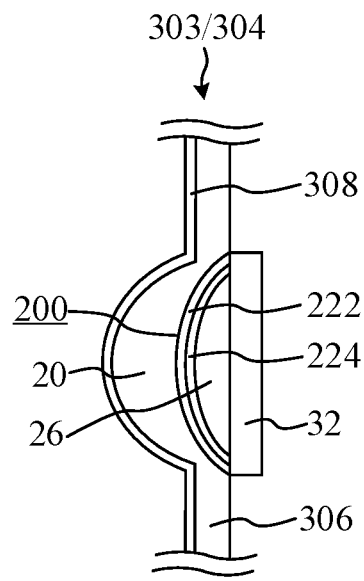
FIG. 7A is a top is a top view of the first select transistor or the second select transistor in the three dimensional memory device according to the invention.
Figure 7B:
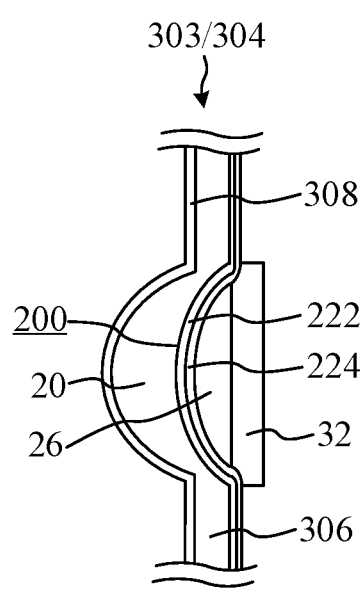
FIG. 7B is a top is a top view of a modification of the first select transistor or the second select transistor in the three dimensional memory device according to the invention.
Figure 8A:
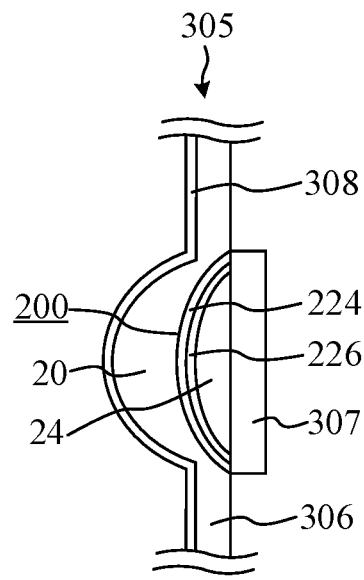
FIG. 8A is a top is a top view of the memory cell in the three dimensional memory device according to the invention.
Figure 8B:
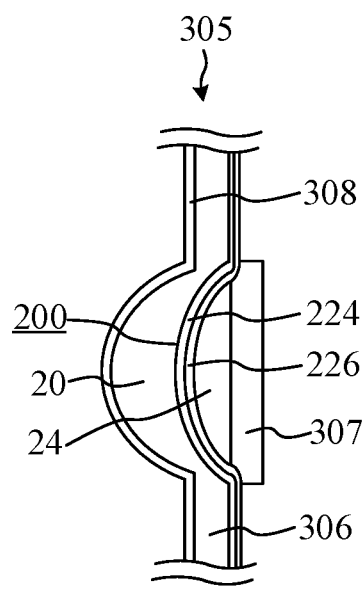
FIG. 8B is a top is a top view of a modification of the memory cell in the three dimensional memory device according to the invention.

Referring to FIG. 7A, FIG. 7B, FIG. 8A and FIG. 8B, FIG. 7A is a top view of the first select transistor 303 or the second select transistor 304. FIG. 7B is a top view of a modification of the first select transistor 303 or the second select transistor 304. FIG. 8A is a top view of the memory cell 305. FIG. 8B is a top view of a modification of the memory cell 305.

As shown in FIG. 7A, each of the first select transistors 303 and the second select transistors 304 also includes a respective first gate oxide film 222 overlaying the base side face 200 of the corresponding pillar 20 of the semiconductor material, a respective second gate oxide film 224 overlaying the first gate oxide film 222, and a respective select gate conductor 26 overlaying the second gate oxide film 224. As shown in FIG. 7B, the respective first gate oxide film 222 and the respective second gate oxide film 224 of each of the first select transistors 303 and the second select transistors 304 extend to two sides. In FIG. 7B, the first gate oxide film 222 and the second gate oxide film 224 cannot affect the function of the first select transistor 303 or the second select transistor 304, and the structure of FIG. 7B is easier to manufacture.

As shown in FIG. 8A, each memory cell 305 also includes the respective second gate oxide film 224 overlaying the base side face 200 of the corresponding pillar 20 of the semiconductor material, a respective gate dielectric multi-layered film 226 overlaying the second gate oxide film 224, and the respective memory gate conductor 24 overlaying the gate dielectric multi-layered film 226. As shown in FIG. 8B, the respective second gate oxide film 224 and the respective gate dielectric multi-layered film 226 of each memory cell 305 extend to two sides. In FIG. 8B, the second gate oxide film 224 and the gate dielectric multi-layered film 226 cannot affect the function of the memory cell 305, and the structure of FIG. 8B is easier to manufacture.

Each of the bit line conductors 306 corresponds to one of the columns 300 and connects the pillars 20 of the semiconductor material of the first select transistors 303, the second select transistors 304 and the memory cells 305 along the corresponding column 300. The word line conductors 307 extend in the normal direction N. Each word line conductor 307 connects the vertically aligned gate conductors 24 of the memory cells 305 of the spaced memory cell layers 30. The select gate line conductors 32 extend in the normal direction N. Each select gate line conductor 32 connects the vertically aligned select gate conductors 26 of the first select transistors 303 or the second select transistors 304 of the spaced memory cell layers 30. Current flows in the bit line conductors 306. Therefore, the three dimensional memory device 3 according to the invention has horizontal current flow. Each word line conductor 307 and each select gate line conductor 32 are embedded in the adjacent second isolation stripe 302.

In one embodiment, similarly, each base side face 200 can be planar, convex or concave. In FIG. 6, the base side face 200 is concave.

In one embodiment, similarly, in each memory cell 305, a combination of the first top face 202 of the pillar 20 of the semiconductor material, a second top face of the second gate oxide film 224, a third top face of the gate dielectric multi-layered film 226 and a fourth top face of the memory gate conductor 24 can exhibit a semi-ellipse, a semi-circle, a triangle, a finger-like shape and a trapezoid.

Figure 9:
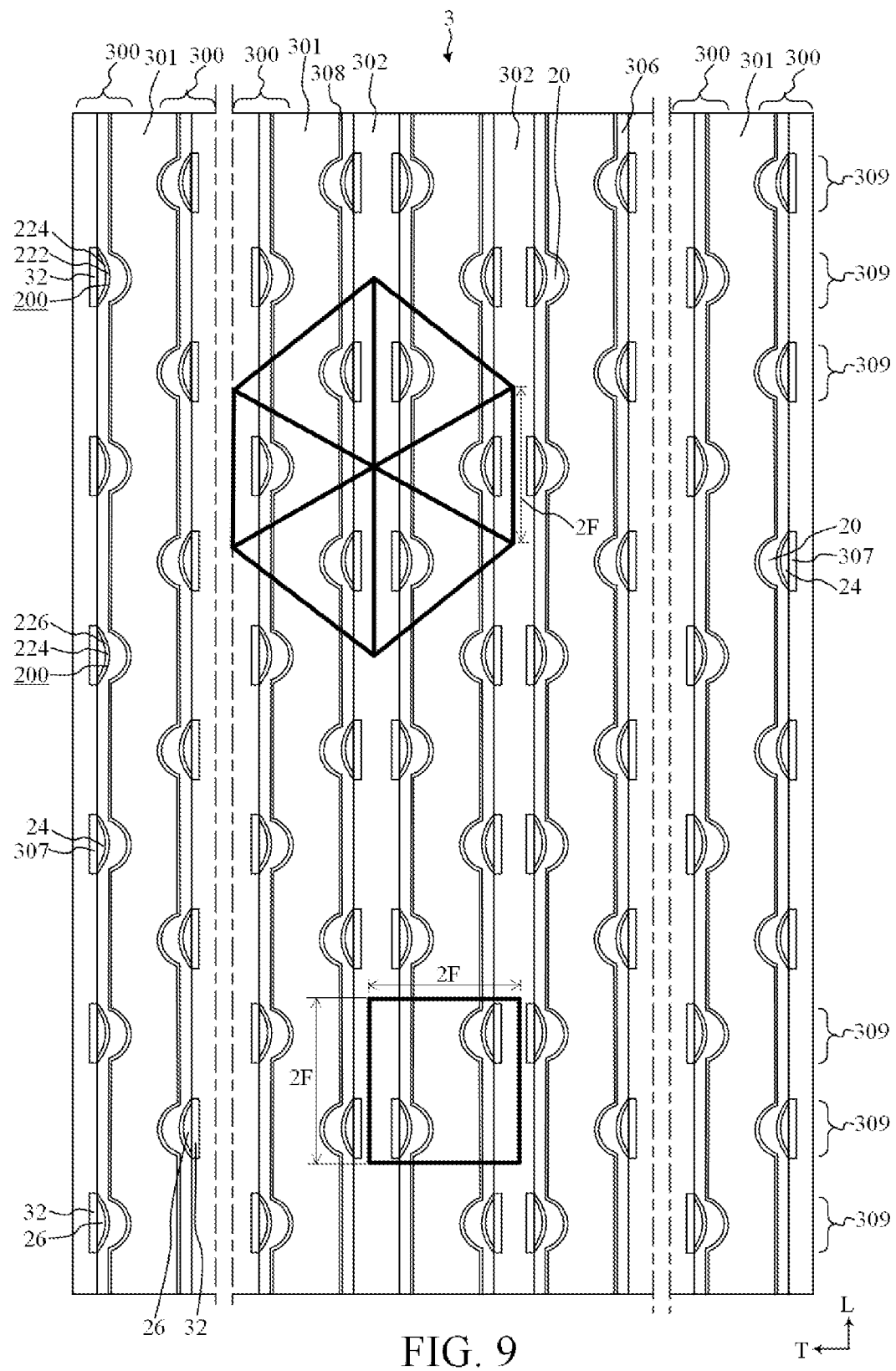
FIG. 9 is a local view of the three dimensional memory device, according to the invention, illustrating the area density of the three dimensional memory device.

Referring to FIG. 9, FIG. 9 is a local top view of the three dimensional memory device 3 according to the invention. As sown in FIG. 9, two memory cells 305 are encircled in a bold line quadrilateral with a side length of 2 F where F represents the process feature size. By the bold line quadrilateral, the area density of the memory cell layer 30 is calculated by the following formula:

area density=2 $F$×2 $F$/2=2 $F^2$

Also as sown in FIG. 9, each of a group of memory cells 305 is respectively encircled in a bold line triangle. The distance of the memory cell 305 can be regulated so that the bold line triangle can be a regular triangle with a side length of 2 F. By the bold line regular triangle, the area density of the memory cell layer 30 is calculated by the following formula:

area density=$\sqrt{3}/4$×(2 F)$^2$≅1.73 $F^2$

Therefore, on theory, each memory cell layer 30 can have an area density equal to or less than 2 times a square of a process feature size, per cell.

Referring to FIGS. 10 through 29, those drawings schematically illustrate a method, according to a preferred embodiment of the invention, of fabrication a three dimensional memory device 3 as shown in FIG. 6.

Figure 10:
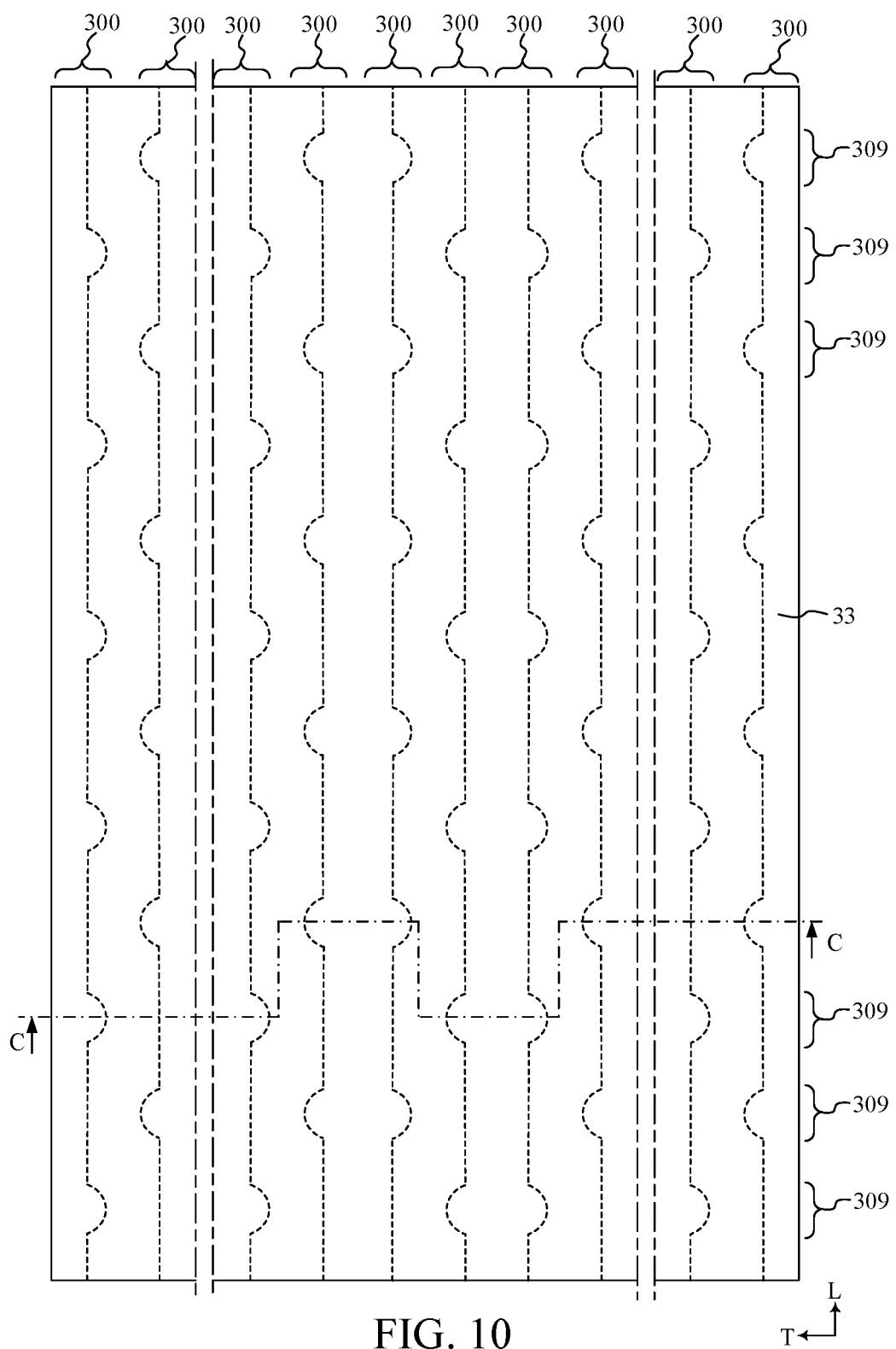
FIG. 10 is a top view of a semi-product of the three dimensional memory device fabricated by the method according to the invention.
Figure 11:
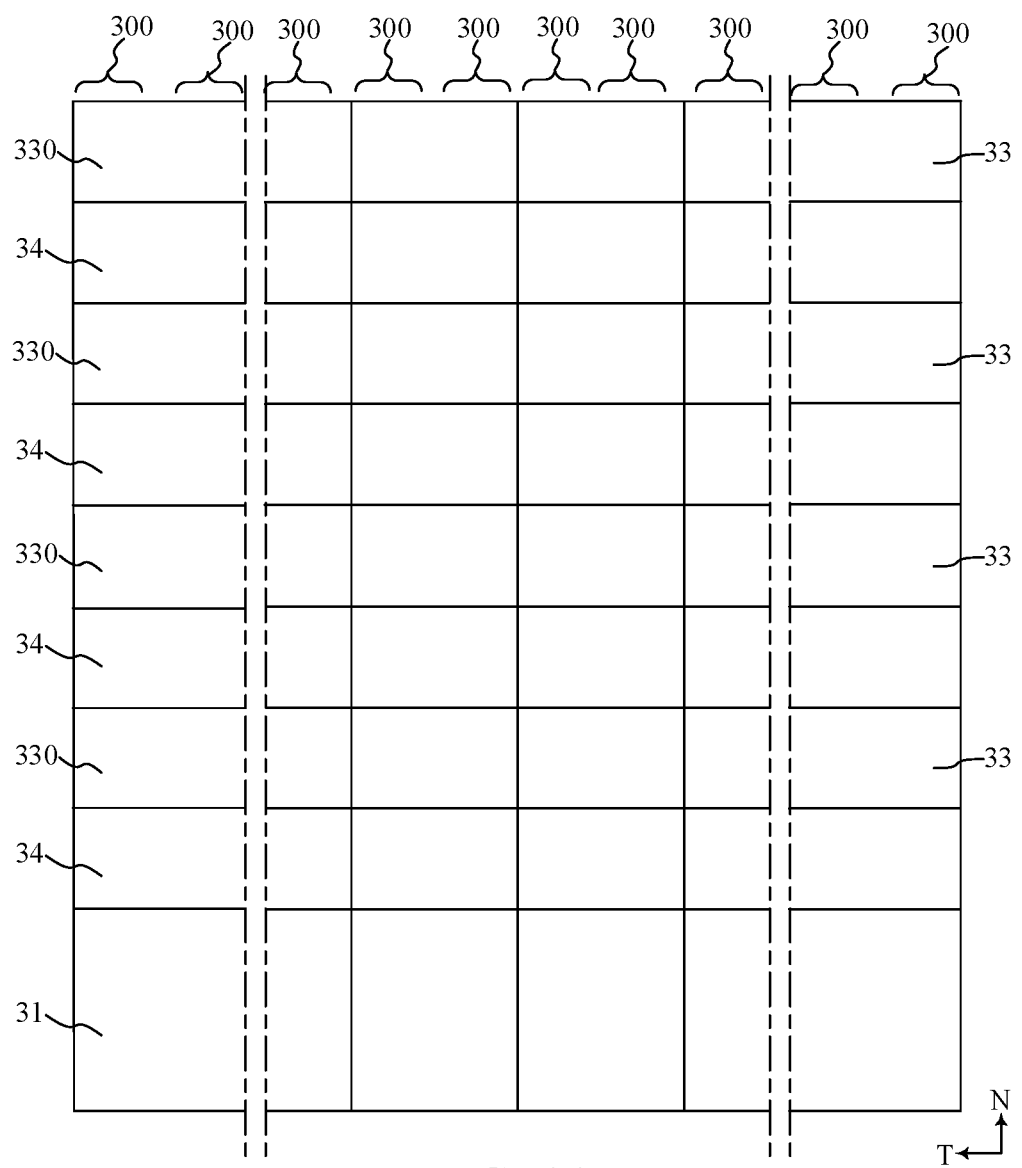
FIG. 11 is a cross-sectional schematic drawing of the semi-product of the three dimensional memory device taken along the C-C line of FIG. 10.

Referring to FIG. 10 and FIG. 11, FIG. 10 is a top view of a semi-product of the three dimensional memory device 3 fabricated by the method according to the invention. FIG. 11 is a cross-sectional schematic drawing of the semi-product of the three dimensional memory device 3 taken along the C-C line of FIG. 10. As shown in FIG. 10 and FIG. 11, the method according to the invention, firstly, is to form a plurality of semiconductor layers 33 and a plurality of spacing insulating layers 34 on a semiconductor substrate 31 defining a normal direction N, a transverse direction T and a longitudinal direction L. The semiconductor layers 33 and the spacing insulating layers 34 are alternately arranged. The plurality of semiconductor layers 33 define a plurality of spaced active layers 330. In FIG. 10, the serpentine dotted lines on the most-top semiconductor layers 33 represent the boundaries of the first trenches 35 to be formed.

Figure 12:
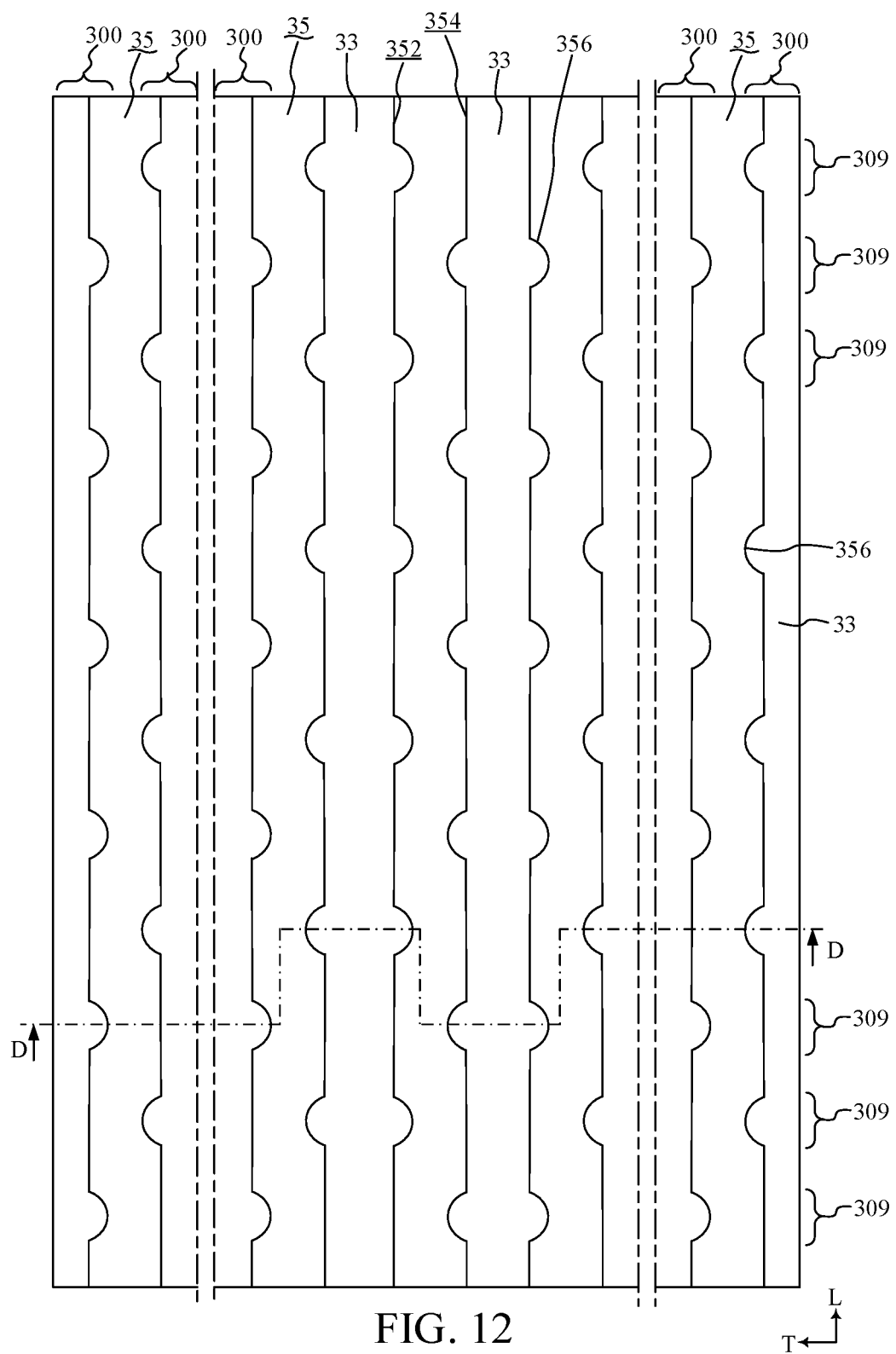
FIG. 12 is another top view of the semi-product of the three dimensional memory device fabricated by the method according to the invention.
Figure 13:
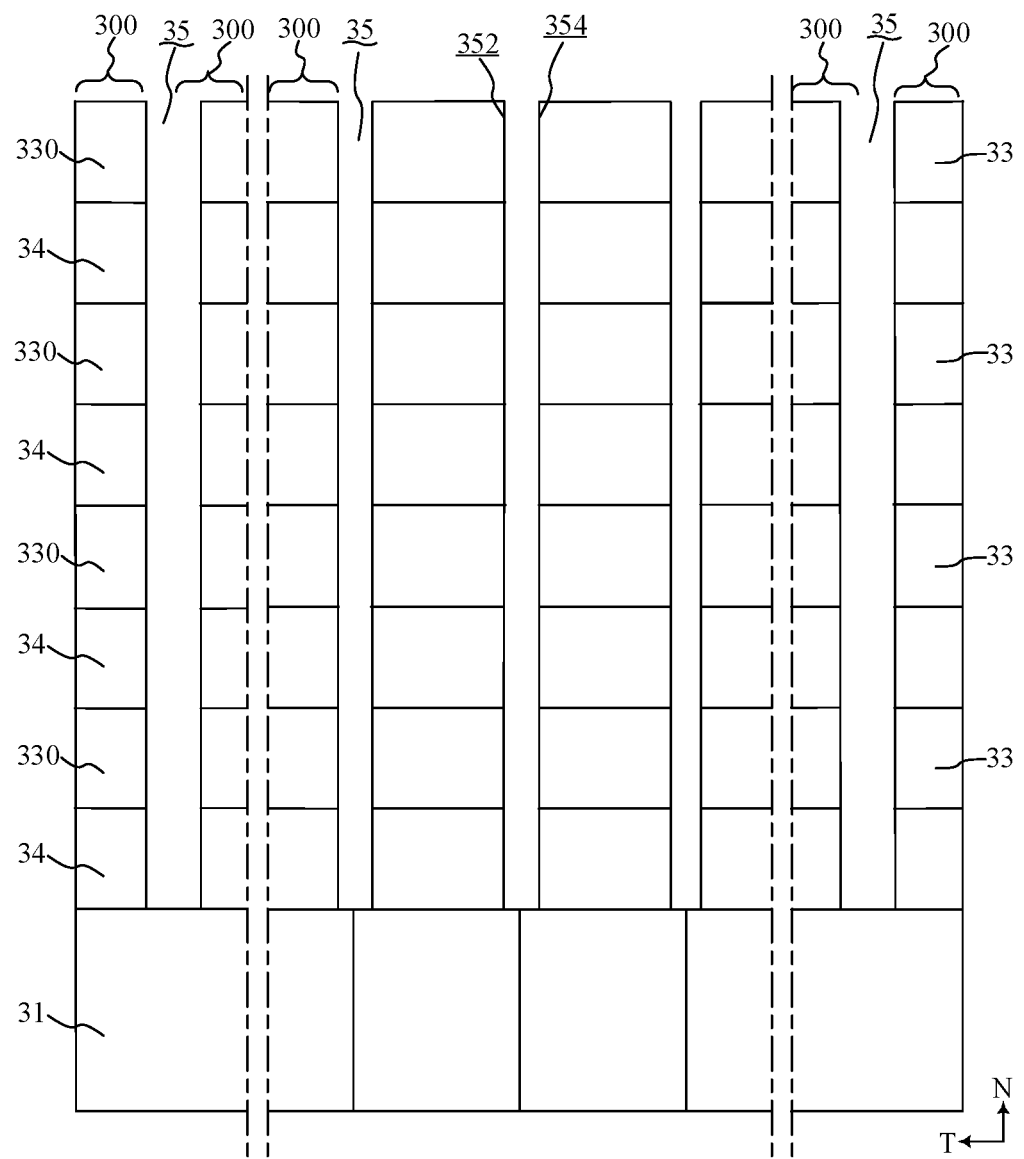
FIG. 13 is a cross-sectional schematic drawing of the semi-product of the three dimensional memory device taken along the D-D line of FIG. 12.

Referring to FIG. 12 and FIG. 13, FIG. 12 is another top view of the semi-product of the three dimensional memory device 3 fabricated by the method according to the invention. FIG. 13 is a cross-sectional schematic drawing of the semi-product of the three dimensional memory device 3 taken along the D-D line of FIG. 12. As shown in FIG. 12 and FIG. 13, next, the method according to the invention is to form a plurality of first trenches 35 parallel to the longitudinal direction L and being through the semiconductor layers 33 and the spacing insulating layers 34. Each first trench 35 has a respective first longitudinal side wall 352, a respective second longitudinal side wall 354 and a plurality of protrusions 356 protruding inwardly. The protrusions 356 on the first longitudinal side wall 352 and the protrusions 356 on the second longitudinal side wall 354 are staggeredly arranged.

Figure 14:
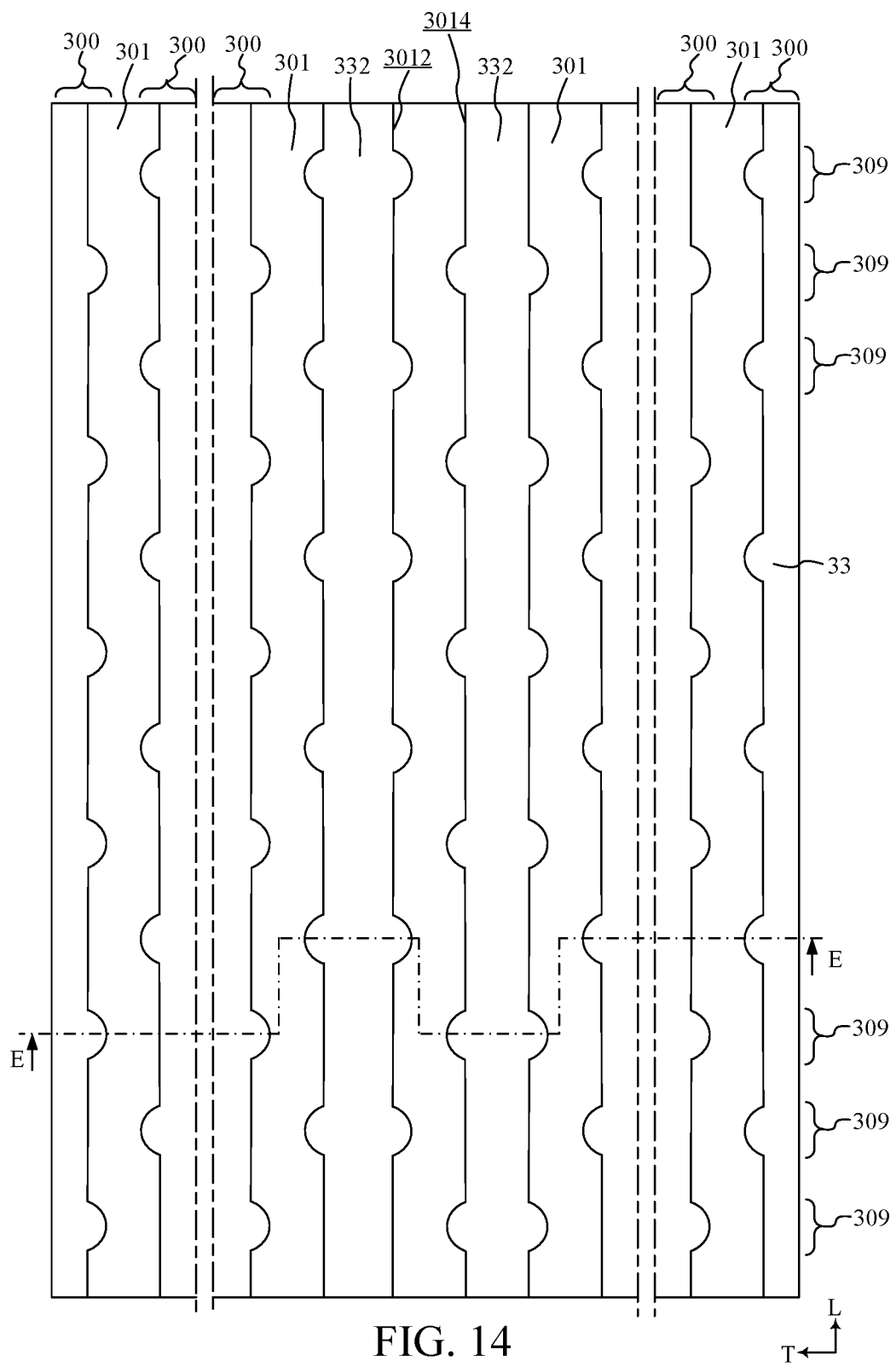
FIG. 14 is another top view of the semi-product of the three dimensional memory device fabricated by the method according to the invention.
Figure 15:
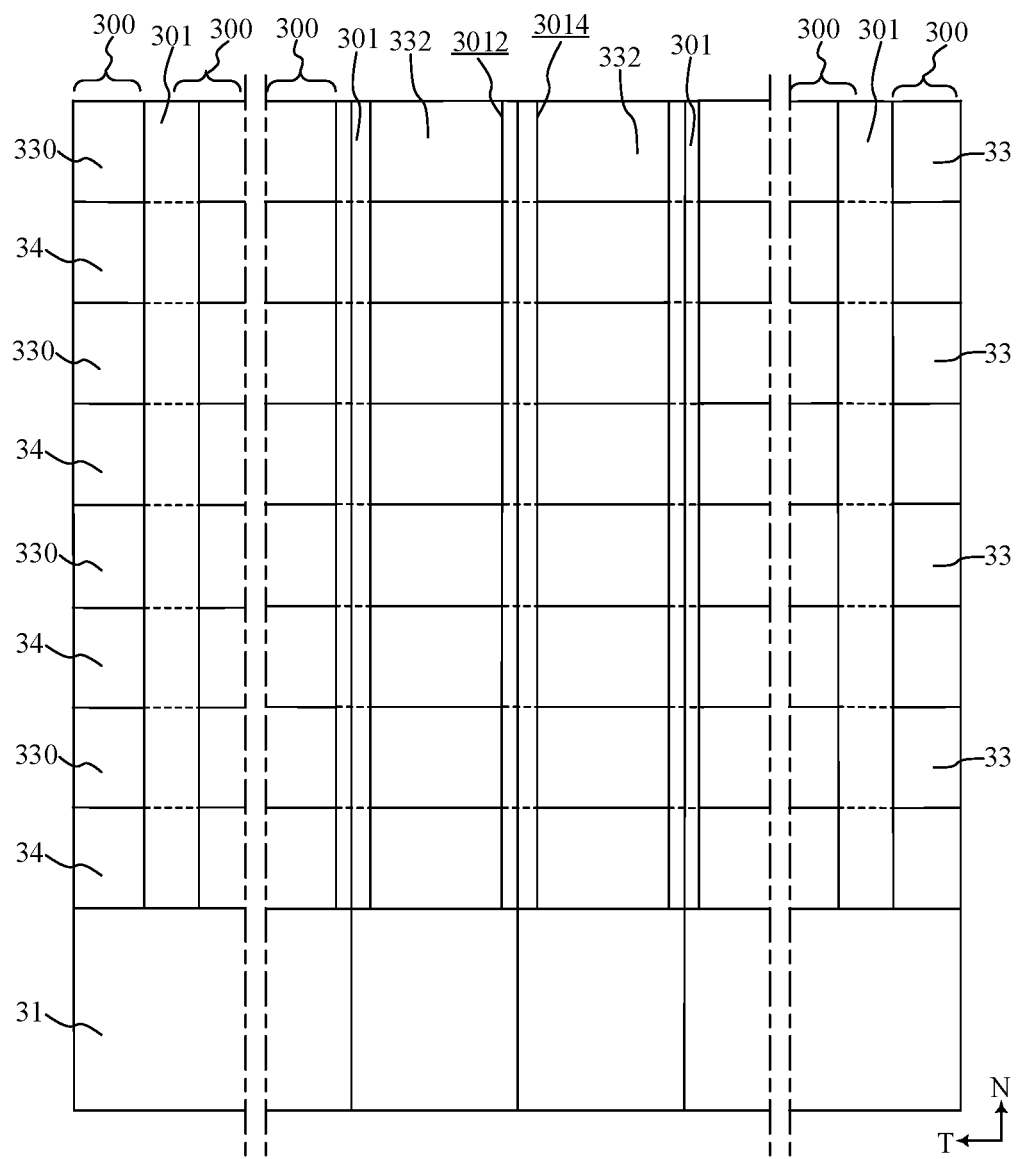
FIG. 15 is a cross-sectional schematic drawing of the semi-product of the three dimensional memory device taken along the E-E line of FIG. 14.

Referring to FIG. 14 and FIG. 15, FIG. 14 is another top view of the semi-product of the three dimensional memory device 3 fabricated by the method according to the invention. FIG. 15 is a cross-sectional schematic drawing of the semi-product of the three dimensional memory device 3 taken along the E-E line of FIG. 14. As shown in FIG. 14 and FIG. 15, then, the method according to the invention is to form a plurality of first isolation stripes 301 which each is filled in one of the first trenches 35 such that a plurality of stacked stripes 332 of the semiconductor layers 33 and the spacing insulating layers 34 and the first isolation stripes 301 are alternately arranged. Each first isolation stripe 301 has a respective first longitudinal edge 3012 and a respective second longitudinal edge 3014.

Figure 16:
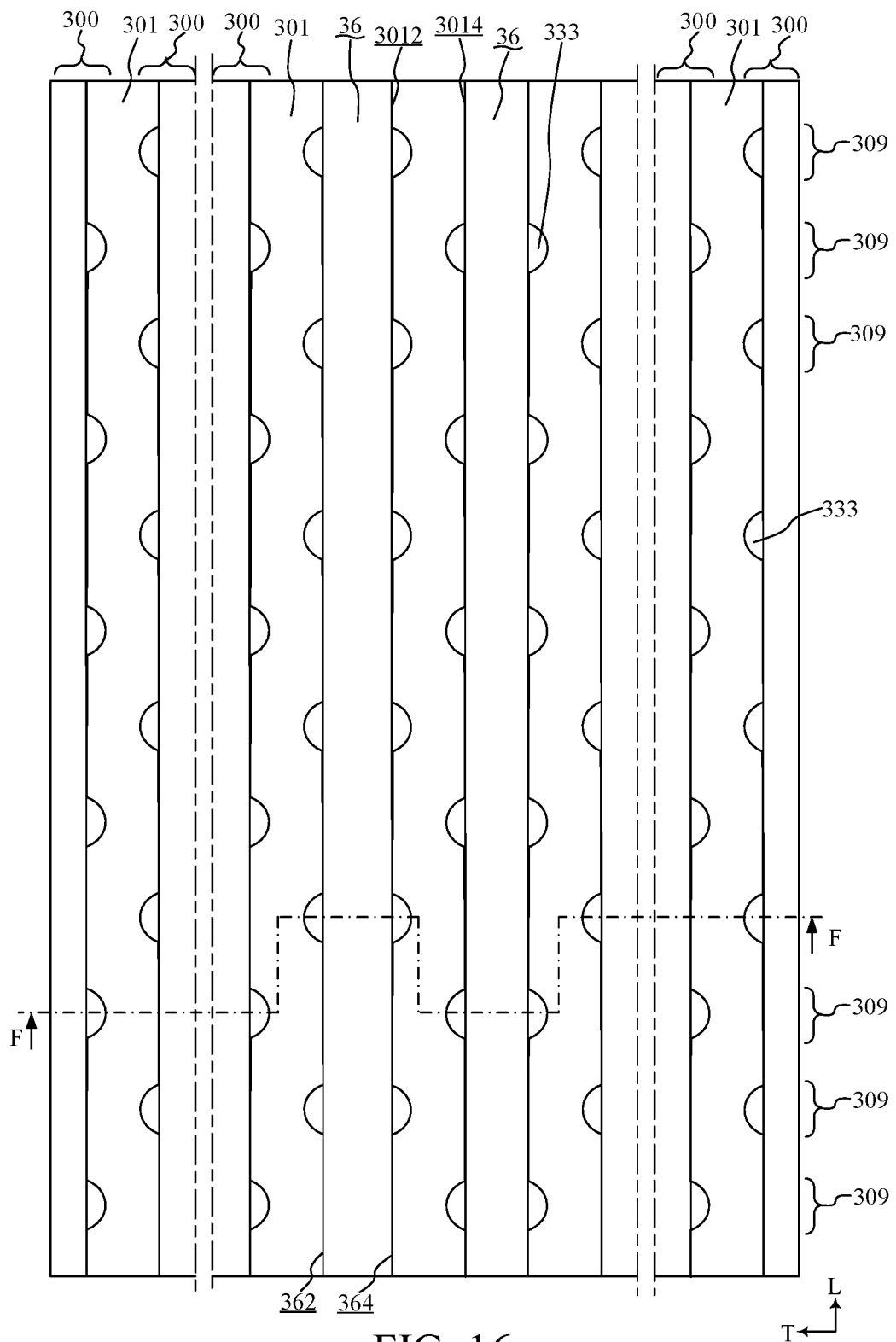
FIG. 16 is another top view of the semi-product of the three dimensional memory device fabricated by the method according to the invention.
Figure 17:
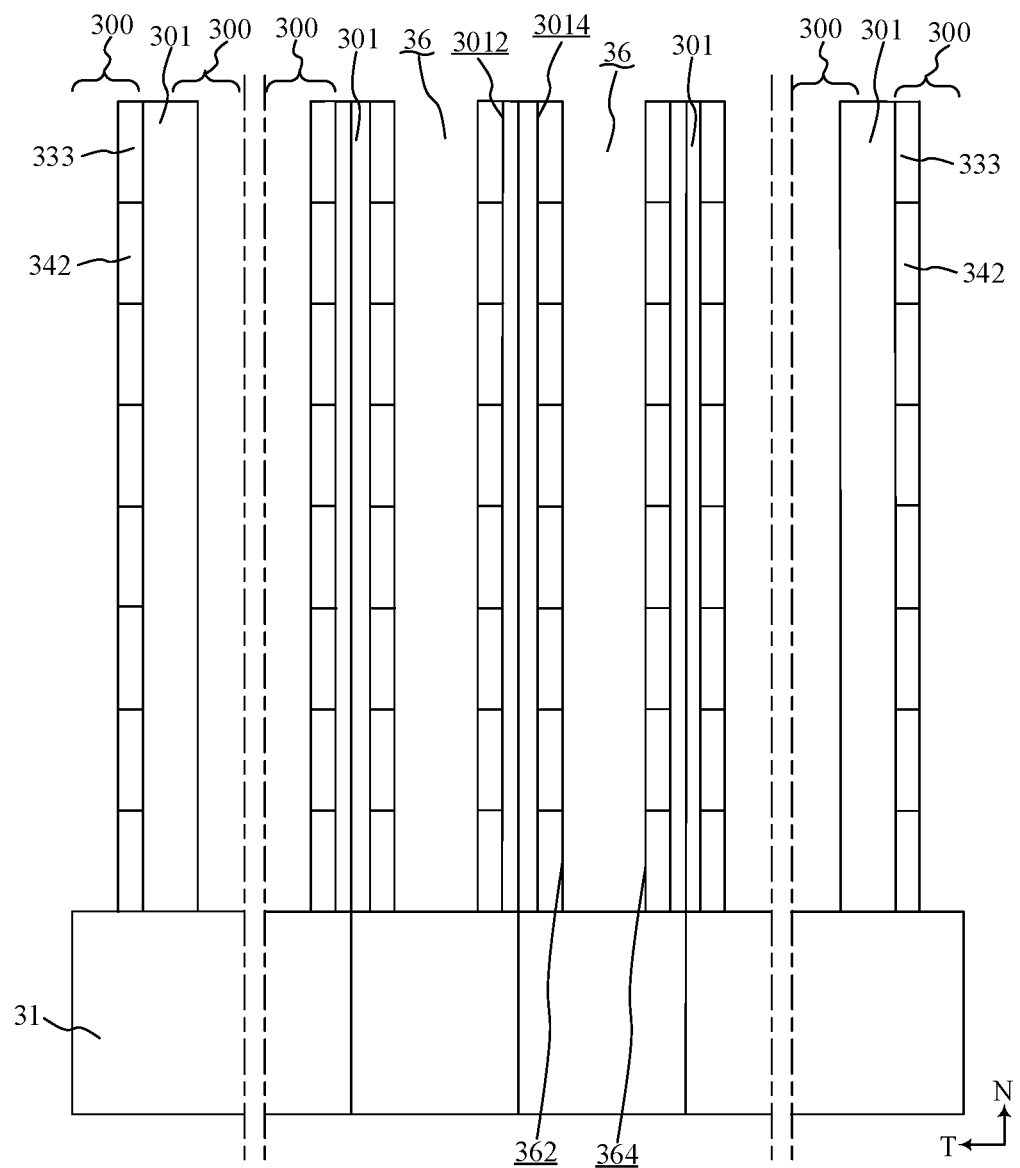
FIG. 17 is a cross-sectional schematic drawing of the semi-product of the three dimensional memory device taken along the F-F line of FIG. 16.

Referring to FIG. 16 and FIG. 17, FIG. 16 is another top view of the semi-product of the three dimensional memory device 3 fabricated by the method according to the invention. FIG. 17 is a cross-sectional schematic drawing of the semi-product of the three dimensional memory device 3 taken along the F-F line of FIG. 16. As shown in FIG. 16 and FIG. 17, subsequently, the method according to the invention is to form a plurality of second trenches 36 parallel to the longitudinal direction L. Each second trench 36 is formed on a portion of one of the stacked stripes 332 and through the semiconductor layers 33 and the spacing insulating layers 34. Each second trench 36 has a respective third longitudinal side wall 362 and a respective fourth longitudinal side wall 364. For the previous stacked stripes 332, a plurality of first retained portions 333 of the semiconductor layers 33, which each corresponds to one of the protrusions 356, are retained.

Figure 18:
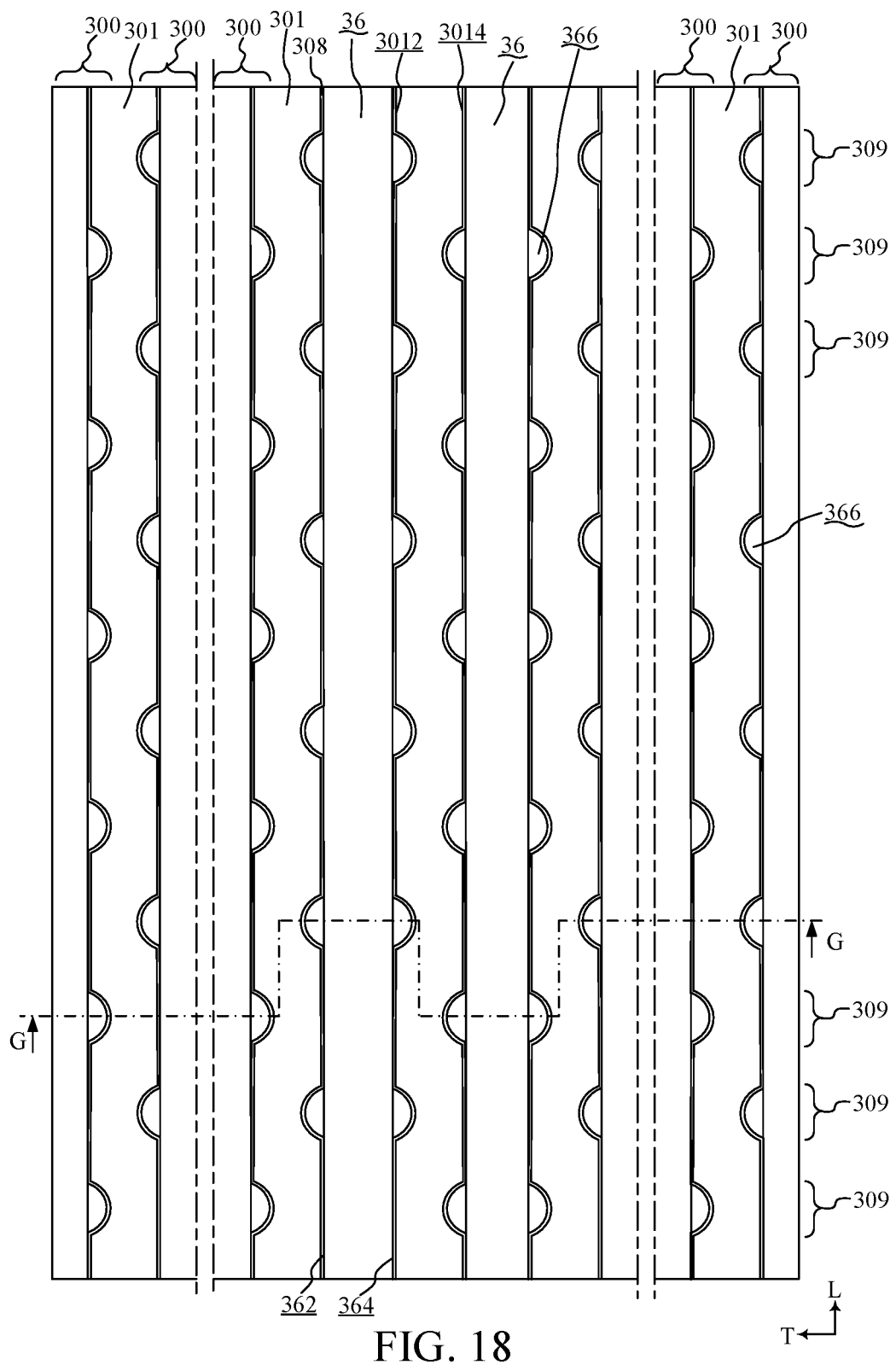
FIG. 18 is another top view of the semi-product of the three dimensional memory device fabricated by the method according to the invention.
Figure 19:
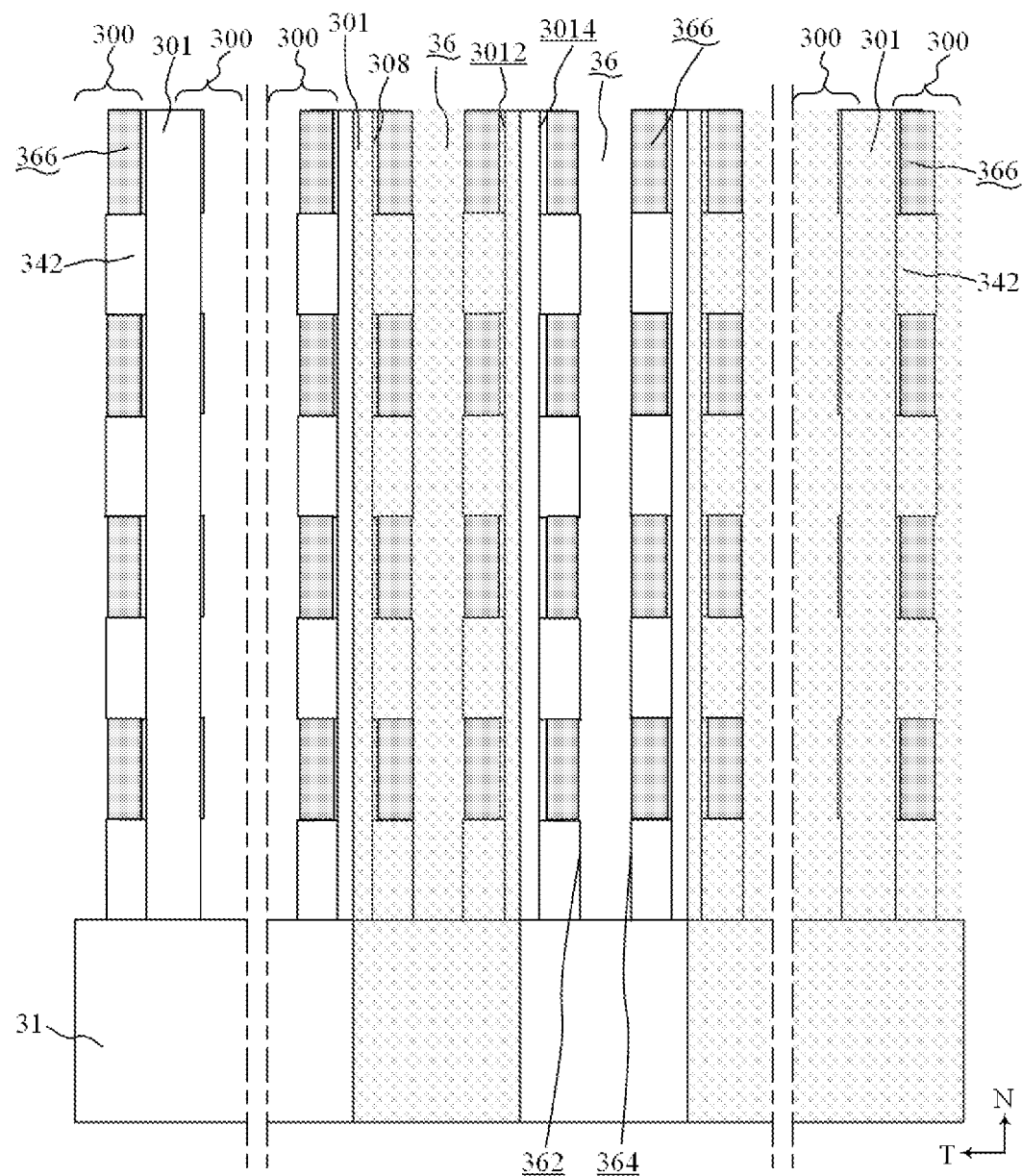
FIG. 19 is a cross-sectional schematic drawing of the semi-product of the three dimensional memory device taken along the G-G line of FIG. 18.

Referring to FIG. 18 and FIG. 19, FIG. 18 is another top view of the semi-product of the three dimensional memory device 3 fabricated by the method according to the invention. FIG. 19 is a cross-sectional schematic drawing of the semi-product of the three dimensional memory device 3 taken along the G-G line of FIG. 18. As shown in FIG. 18 and FIG. 19, afterward, the method according to the invention is to remove the plurality of first retained portions 333 of the semiconductor layers 33, which each corresponds to one of the protrusions 356, a plurality of recesses 366 are formed on the third longitudinal side walls 362 and the fourth longitudinal side walls 364 at each active layer 330. In particular, the recesses 366 at one side of each first isolation stripe 301 and the recesses 366 at the other side of said one first isolation stripe 301 are staggeredly arranged.

Further, as shown in FIG. 18 and FIG. 19, at each semiconductor layers 33, the respective first longitudinal edge 3012 and the respective second longitudinal edge 3014 of each first isolation stripe 301 are respectively coated by an insulating liner film 308.

In one embodiment, as shown in FIG. 19, after removing the first retained portions 333 of the semiconductor layers 33, a plurality of second retained portions 342 of the spacing insulating layers 34 form a plurality of spacers which each locates between two vertically neighboring recesses 366.

Figure 20:
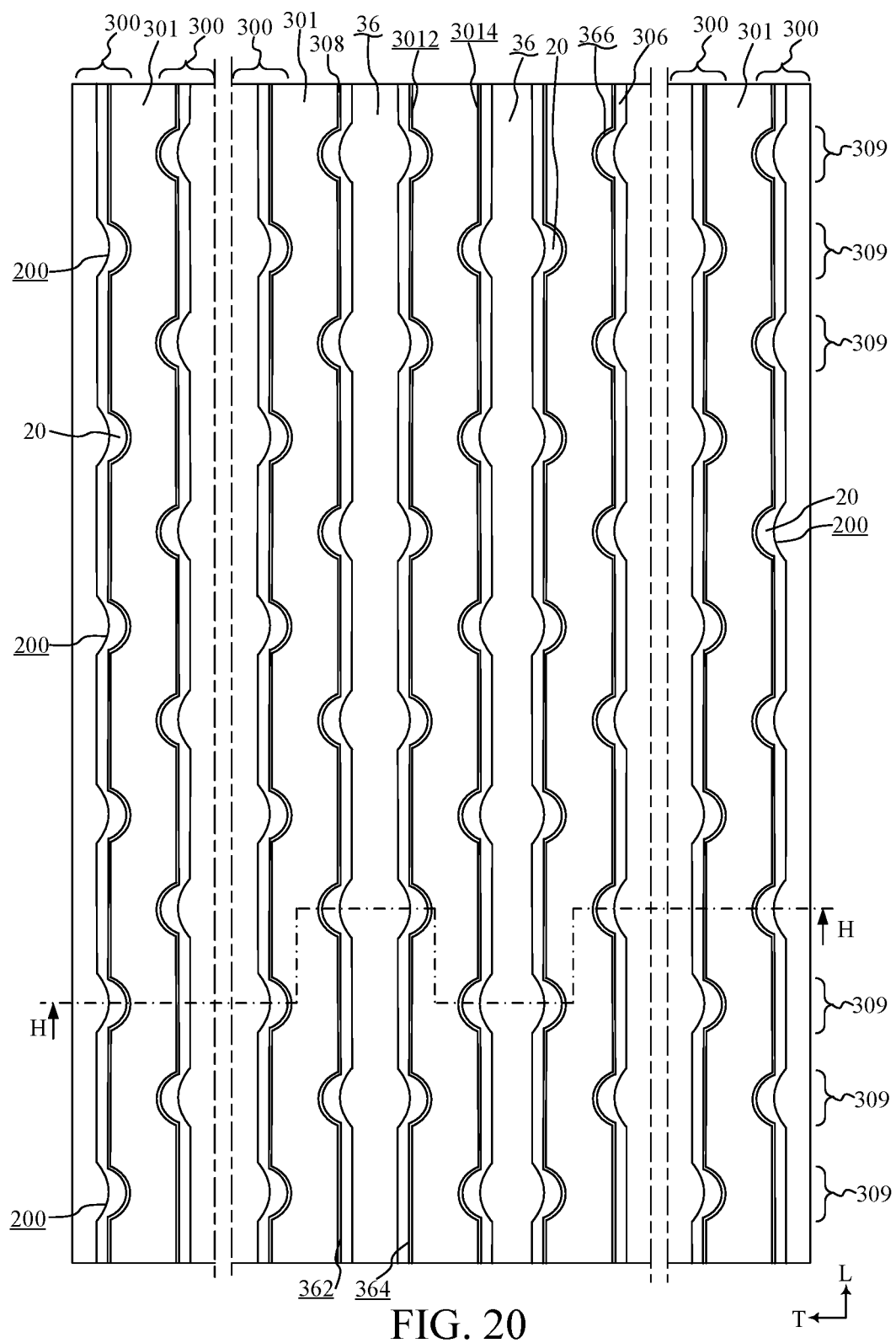
FIG. 20 is another top view of the semi-product of the three dimensional memory device fabricated by the method according to the invention.
Figure 21:
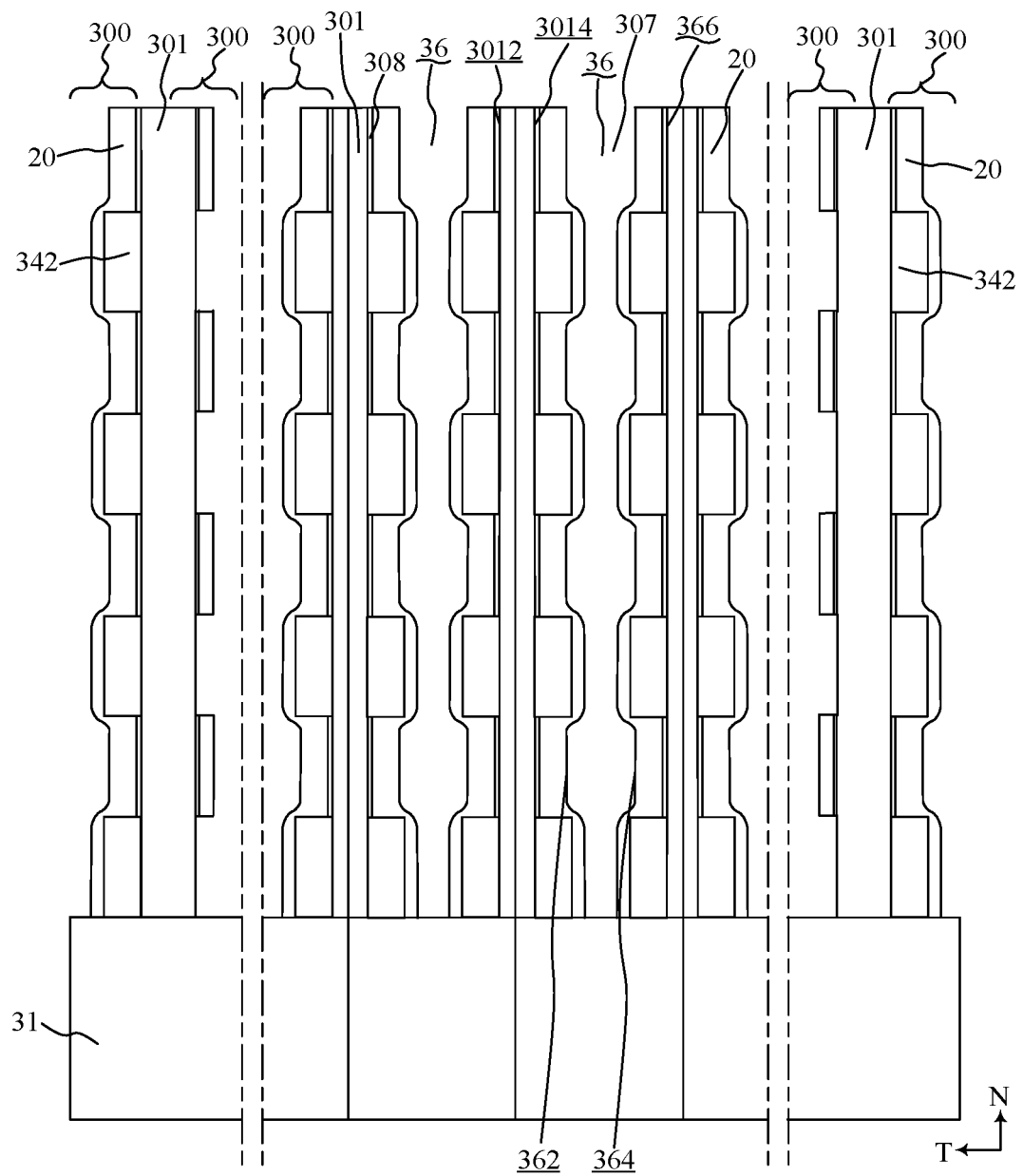
FIG. 21 is a cross-sectional schematic drawing of the semi-product of the three dimensional memory device taken along the H-H line of FIG. 20.

Referring to FIG. 20 and FIG. 21, FIG. 20 is another top view of the semi-product of the three dimensional memory device 3 fabricated by the method according to the invention. FIG. 21 is a cross-sectional schematic drawing of the semi-product of the three dimensional memory device 3 taken along the H-H line of FIG. 20. As shown in FIG. 20 and FIG. 21, next, the method according to the invention is to form a plurality of pillars 20 of a semiconductor material and a plurality of bit line conductors 306. The pillars 20 of the semiconductor material at each active layer 330 are arranged in a plurality of columns 300 and a plurality of rows 309. Also, referring to FIG. 3 and FIG. 4, each pillar 20 of the semiconductor material is fitted in one of the recesses 366, and has a respective base side face 200 parallel to the normal direction N, a respective tapered side face 201 opposite to the base side face 200, a respective first top face 202 perpendicular to the normal direction N, a respective bottom face 203 opposite to the first top face 202, a respective front side face 204 adjacent to the base side face 200 and the tapered side face 201, and a respective rear side face 205 opposite to the front side face 204. A respective first elongated portion 206, sandwiched among the base side face 200, the front side face 204, the bottom face 203 and the first top face 202, forms a respective source region. A respective second elongated portion 207, sandwiched among the base side face 200, the rear side face 205, the bottom face 203 and the first top face 202, forms a respective drain region. A respective plate portion 208, on the base side face 200 and between the first elongated portion 206 and the second elongated portion 207, forms a respective channel region. Other portion of the pillar 20 of the semiconductor material forms a respective body region. Each bit line conductor 306 corresponds to one of the columns 300 and connects the pillars 20 along the corresponding column 300.

In some embodiments, the semiconductor material forming the pillar 20 can be, for example, polysilicon. The source region and the drain region can be doped with an n-type dopant (e.g., phosphorus or arsenic) or a p-type dopant (e.g., boron). The channel region can be doped with a dopant of a different conductivity from the source region and the drain region. A portion of the body region that is away from the channel region, the source region and the drain region can be optionally doped with the specific dopant.

In one embodiment, to easily manufacture, the semiconductor material forming the pillars 20 can also overlay the plurality of second retained portions 342 of the spacing insulating layers 34.

Figure 22:
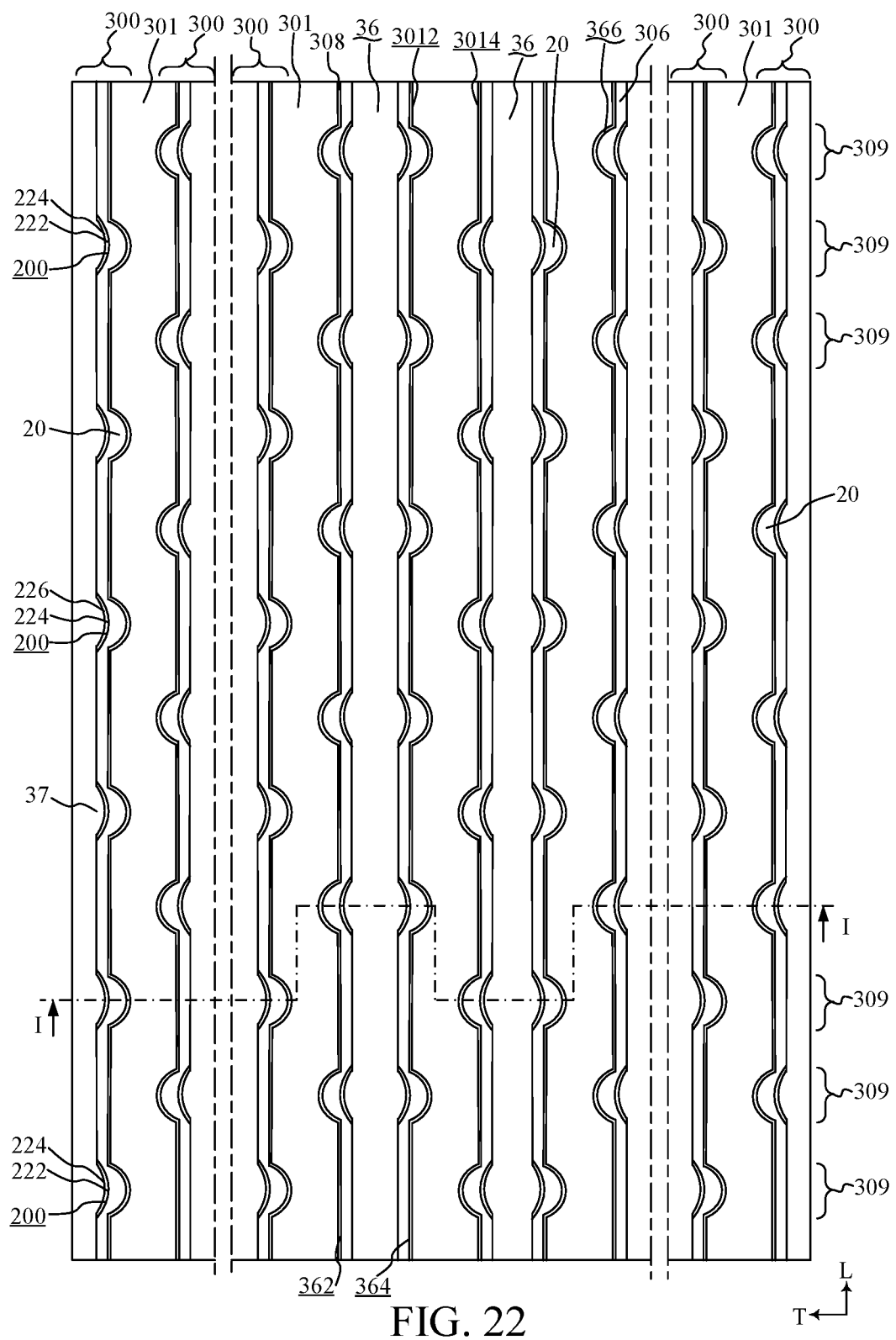
FIG. 22 is another top view of the semi-product of the three dimensional memory device fabricated by the method according to the invention.
Figure 23:
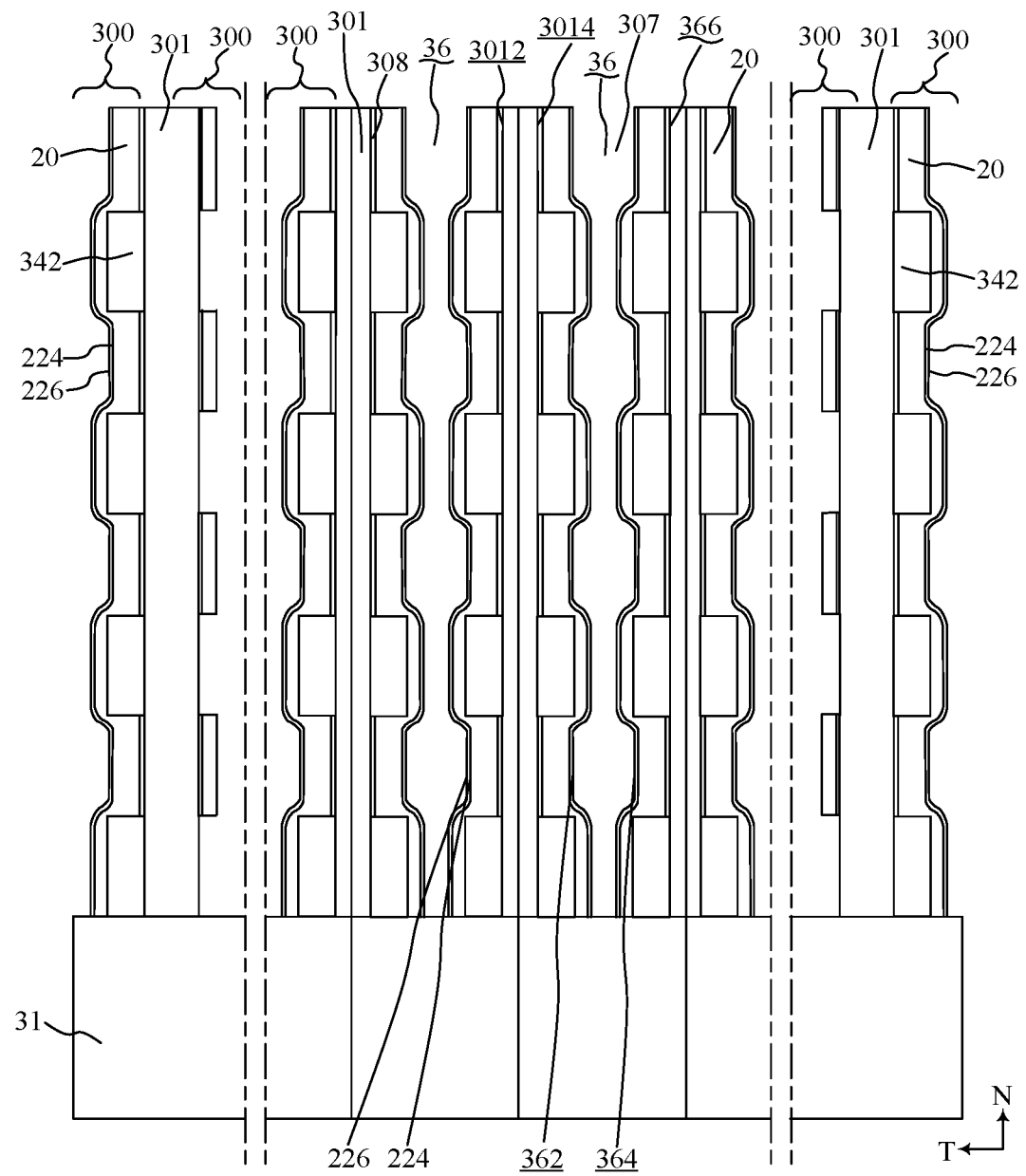
FIG. 23 is a cross-sectional schematic drawing of the semi-product of the three dimensional memory device taken along the I-I line of FIG. 22.

Referring to FIG. 22 and FIG. 20, FIG. 23 is another top view of the semi-product of the three dimensional memory device 3 fabricated by the method according to the invention. FIG. 23 is a cross-sectional schematic drawing of the semi-product of the three dimensional memory device 3 taken along the I-I line of FIG. 22. As shown in FIG. 22 and FIG. 23, then, the method according to the invention is to form a plurality of first gate oxide films 222 which each overlays the base side face 200 of one of the pillars 20 of the semiconductor material arranged in at least two first end rows 309 and at least two second end rows 309 among the plurality of rows 309.

Also as shown in FIG. 22 and FIG. 23, subsequently, the method according to the invention is to form a plurality of second gate oxide films 224 which each overlays the base side face 200 of one of the pillars 20 of the semiconductor material arranged in the rows 309 between the at least two first end rows 309 and the at least two second end rows 309 or one of the first gate oxide films 222.

Also as shown in FIG. 22 and FIG. 23, afterward, the method according to the invention is to form a plurality of gate dielectric multi-layered films 226 which each overlays one of the second gate oxide films 224 overlaying the base side faces 200 of the pillars 20 of the semiconductor material arranged in the rows 309 between the at least two first end rows 309 and the at least two second end rows 309.

In one embodiment, to easily manufacture, the first gate oxide films 222, the second gate oxide films 224 and the gate dielectric multi-layered films 226 can also overlay the semiconductor material overlaying the second retained portions 342.

Figure 24:
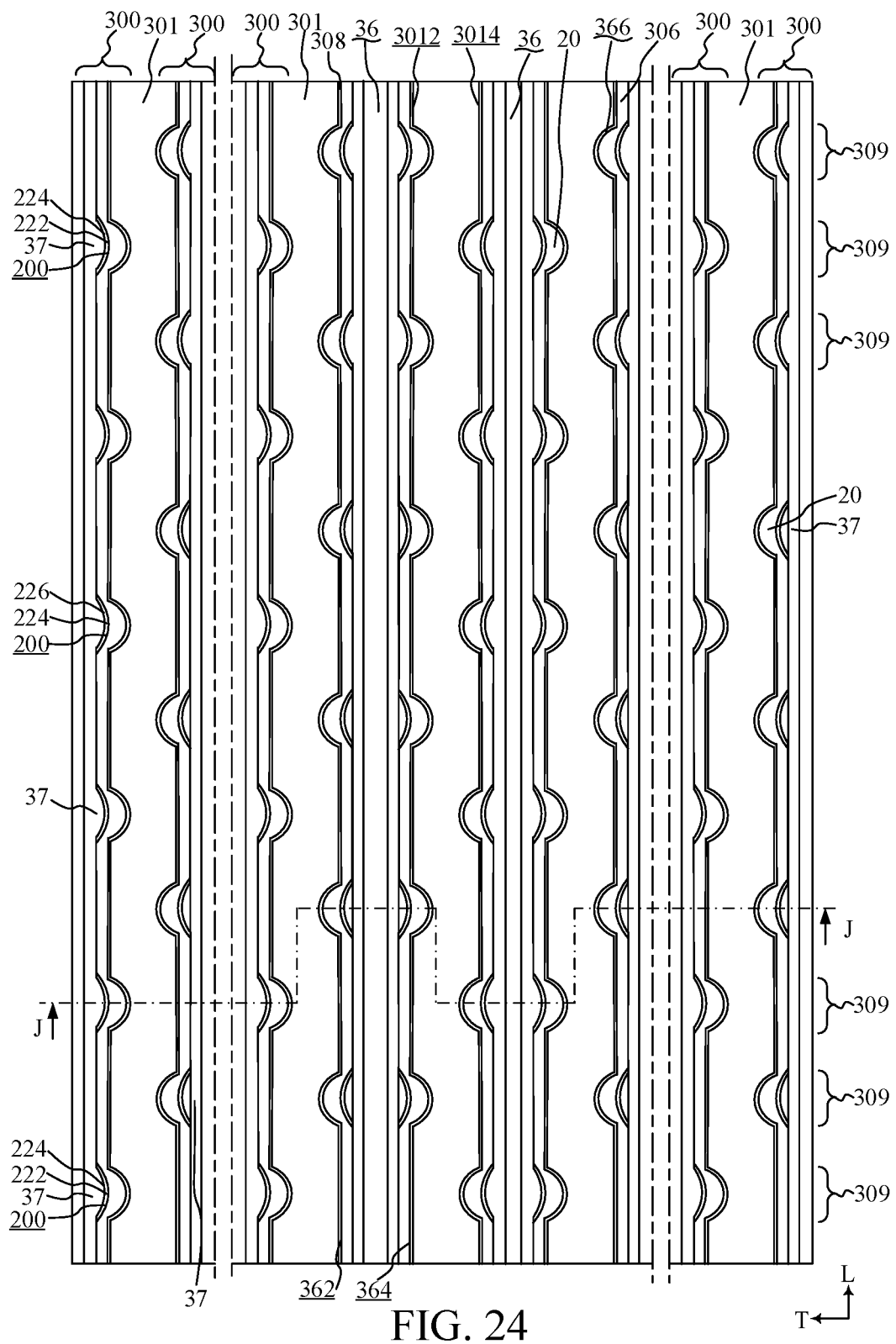
FIG. 24 is another top view of the semi-product of the three dimensional memory device fabricated by the method according to the invention.
Figure 25:
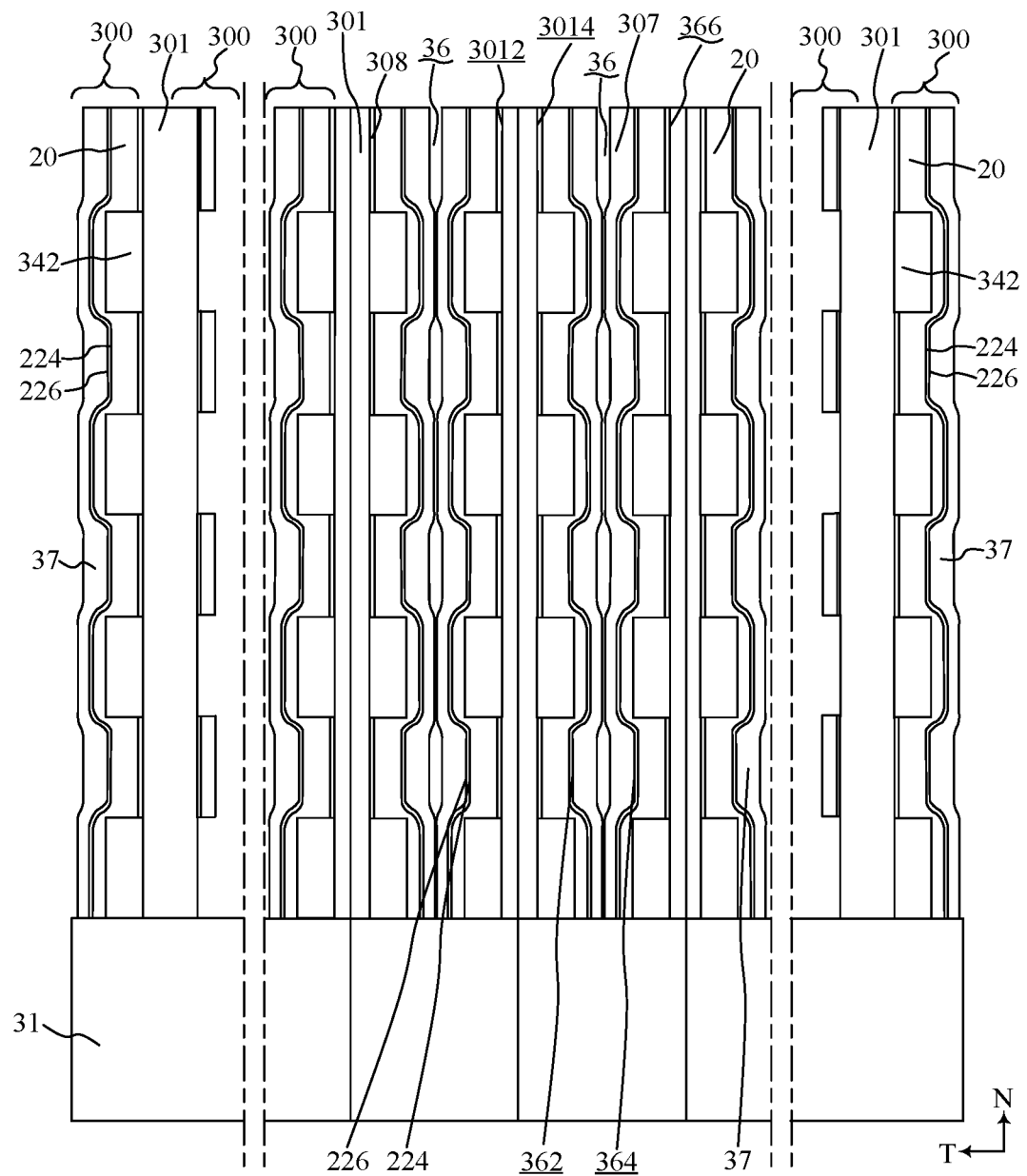
FIG. 25 is a cross-sectional schematic drawing of the semi-product of the three dimensional memory device taken along the J-J line of FIG. 24.

Referring to FIG. 24 and FIG. 25, FIG. 24 is another top view of the semi-product of the three dimensional memory device 3 fabricated by the method according to the invention. FIG. 25 is a cross-sectional schematic drawing of the semi-product of the three dimensional memory device 3 taken along the J-J line of FIG. 24. As shown in FIG. 24 and FIG. 25, next, the method according to the invention is to form a plurality of conductor layers 37 which each overlays one of the third longitudinal side wall 362 and the fourth longitudinal side wall 364 of one of the second trenches 36.

Figure 26:
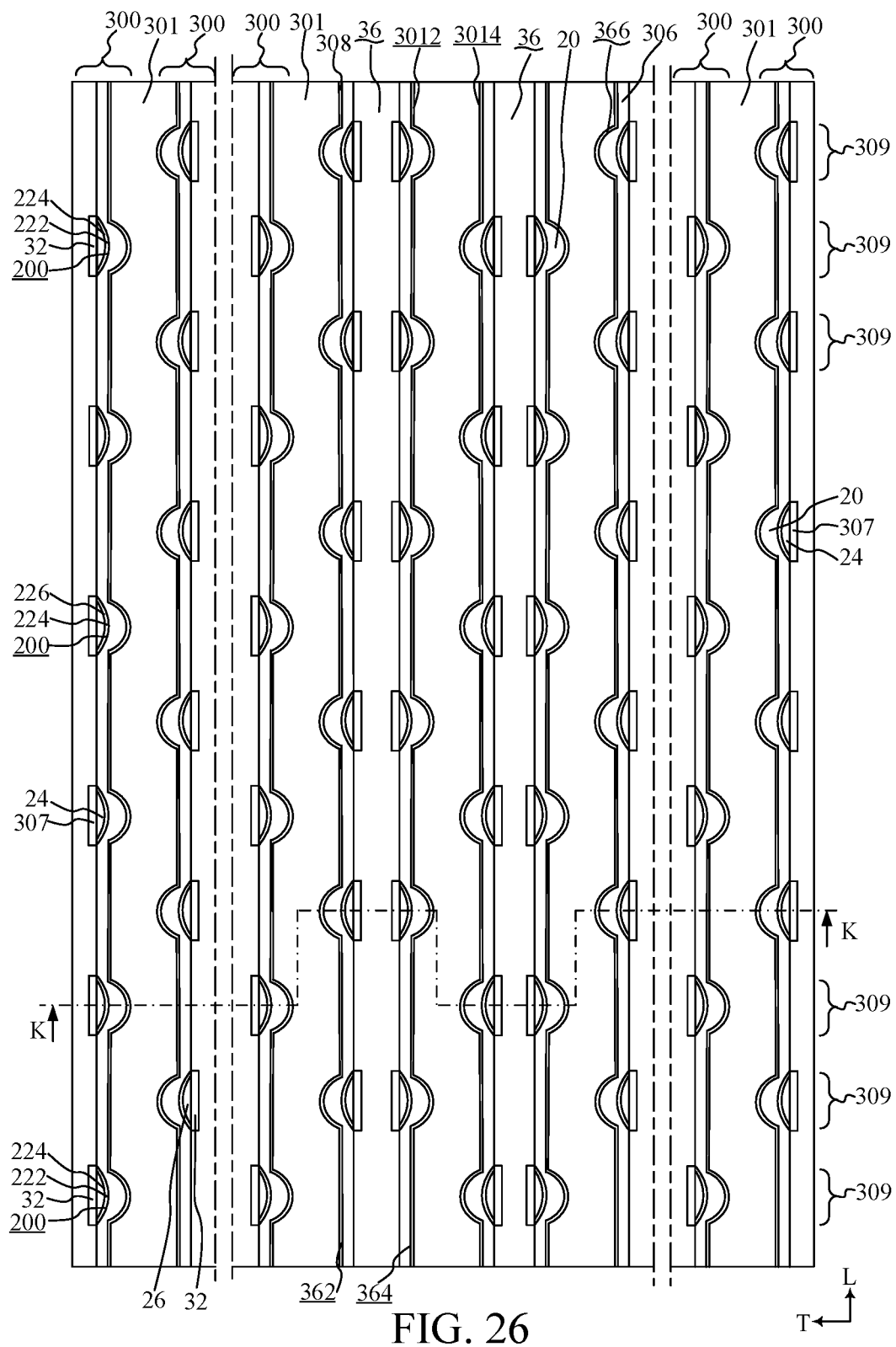
FIG. 26 is another top view of the semi-product of the three dimensional memory device fabricated by the method according to the invention.
Figure 27:
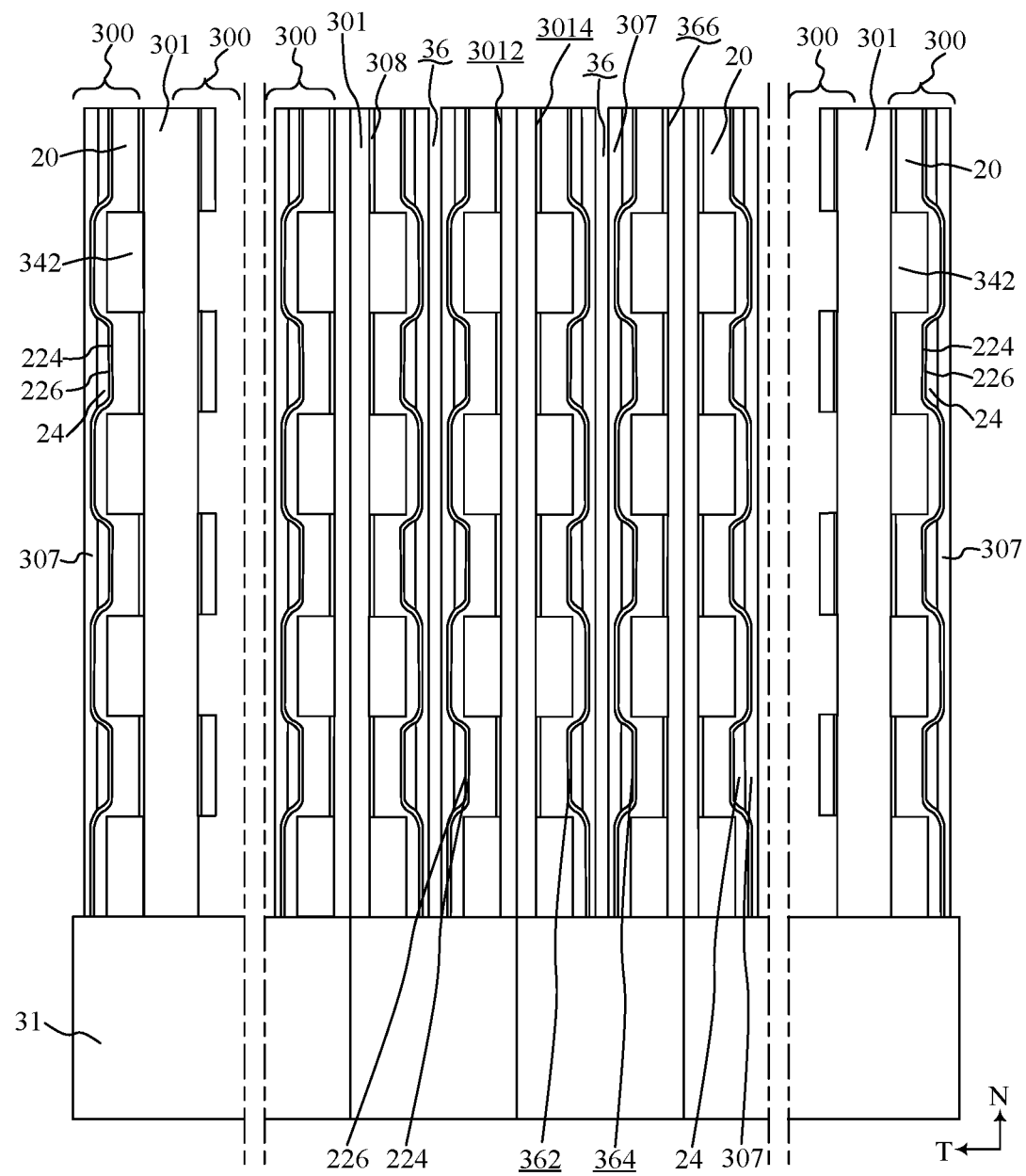
FIG. 27 is a cross-sectional schematic drawing of the semi-product of the three dimensional memory device taken along the K-K line of FIG. 26.

Referring to FIG. 26 and FIG. 27, FIG. 26 is another top view of the semi-product of the three dimensional memory device 3 fabricated by the method according to the invention. FIG. 27 is a cross-sectional schematic drawing of the semi-product of the three dimensional memory device 3 taken along the K-K line of FIG. 26. As shown in FIG. 26 and FIG. 27, then, the method according to the invention is to partially etch the conductor layers 37 to form a plurality of memory gate conductors 24, a plurality of word line conductors 307, a plurality of select gate conductors 26 and a plurality of select gate line conductors 32. Each select gate conductor 26 overlays one of the second gate oxide films 224, and each memory gate conductor 24 overlays one of the gate dielectric multi-layered films 226. Each word line conductor 307 extends in the normal direction N, and connects the vertically aligned gate conductors 24 arranged in the rows 309 between the at least two first end rows 309 and the at least two second end rows 309 at all of the active layers 330. Each select gate line conductor 32 extends in the normal direction N, and connects the vertically aligned select gate conductors 26 arranged in the at least two first end rows 309 and the at least two second end rows 309 at all of the active layers 330.

Figure 28:
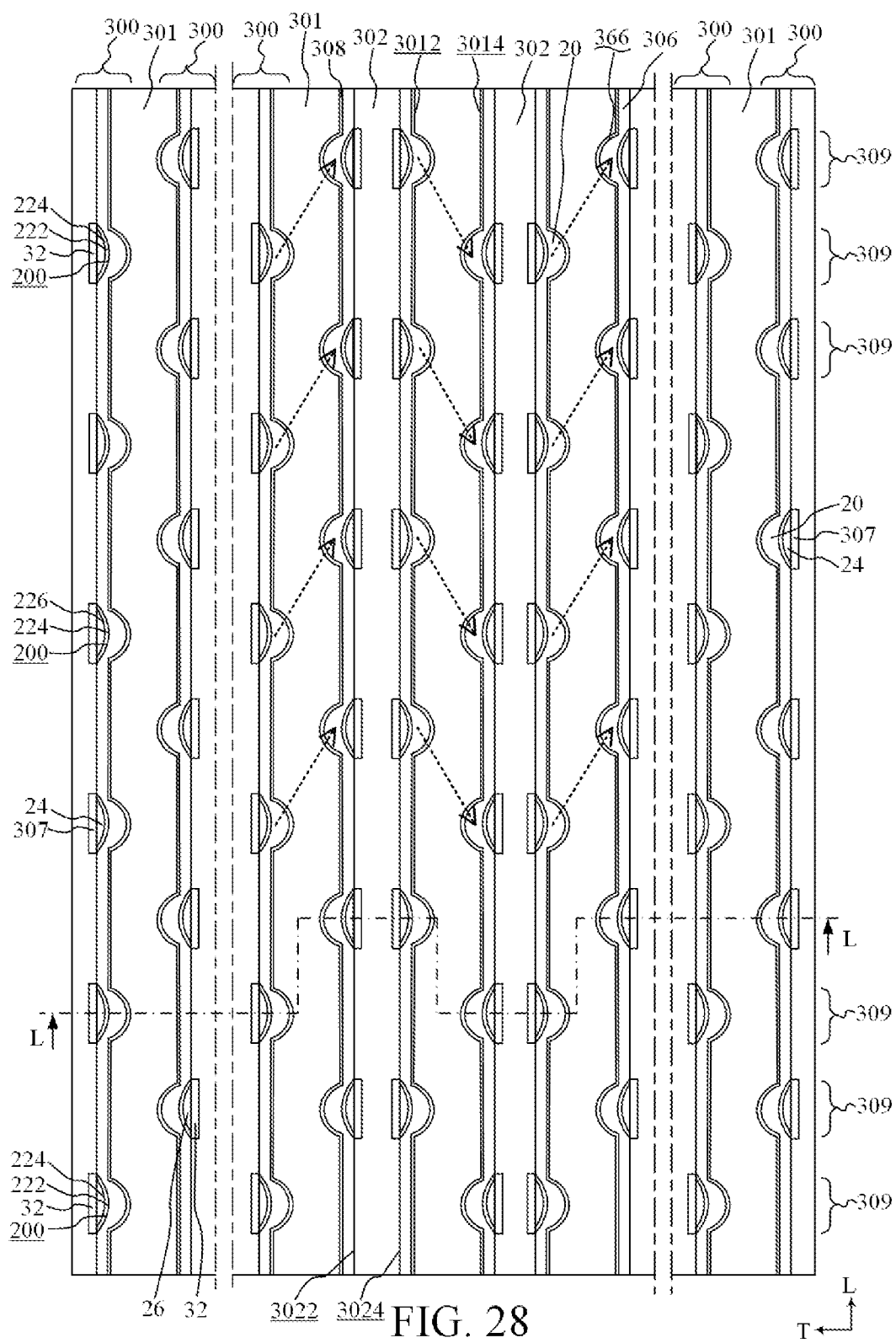
FIG. 28 is another top view of the three dimensional memory device fabricated by the method according to the invention.
Figure 29:
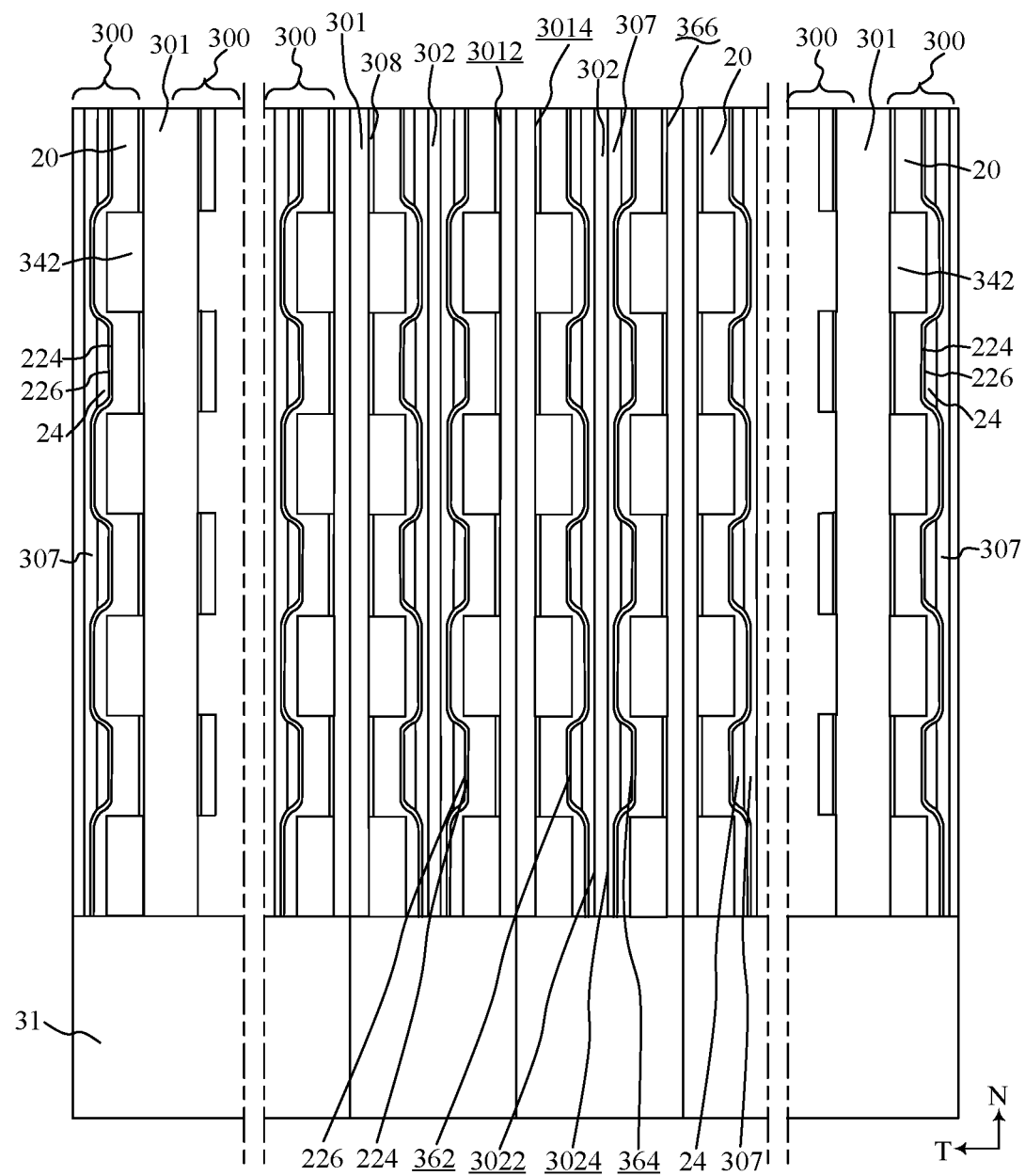
FIG. 29 is a cross-sectional schematic drawing of the semi-product of the three dimensional memory device taken along the L-L line of FIG. 28.

Referring to FIG. 28 and FIG. 29, FIG. 28 is another top view of the three dimensional memory device 3 fabricated by the method according to the invention. FIG. 29 is a cross-sectional schematic drawing of the semi-product of the three dimensional memory device 3 taken along the L-L line of FIG. 28. As shown in FIG. 28 and FIG. 29, finally, the method according to the invention is to form a plurality of second isolation stripes 302 which each is filled in one of the second trenches 36. Each second isolation stripe 302 has a respective third longitudinal edge 3022 and a respective fourth longitudinal edge 3024. Each memory gate conductor 24, each word line conductor 307, each select gate conductor 26 and each select gate line conductor 32 face the third longitudinal side wall 3022 or the fourth longitudinal side wall 3024 of one of the second isolation stripes 302. Finally, a passivation layer (not shown in FIG. 28 and FIG. 29) is formed to overlay the structure of the three dimensional memory device 3 of FIG. 28 and FIG. 29 to protect the three dimensional memory device 3 according to the invention.

Figure 30:
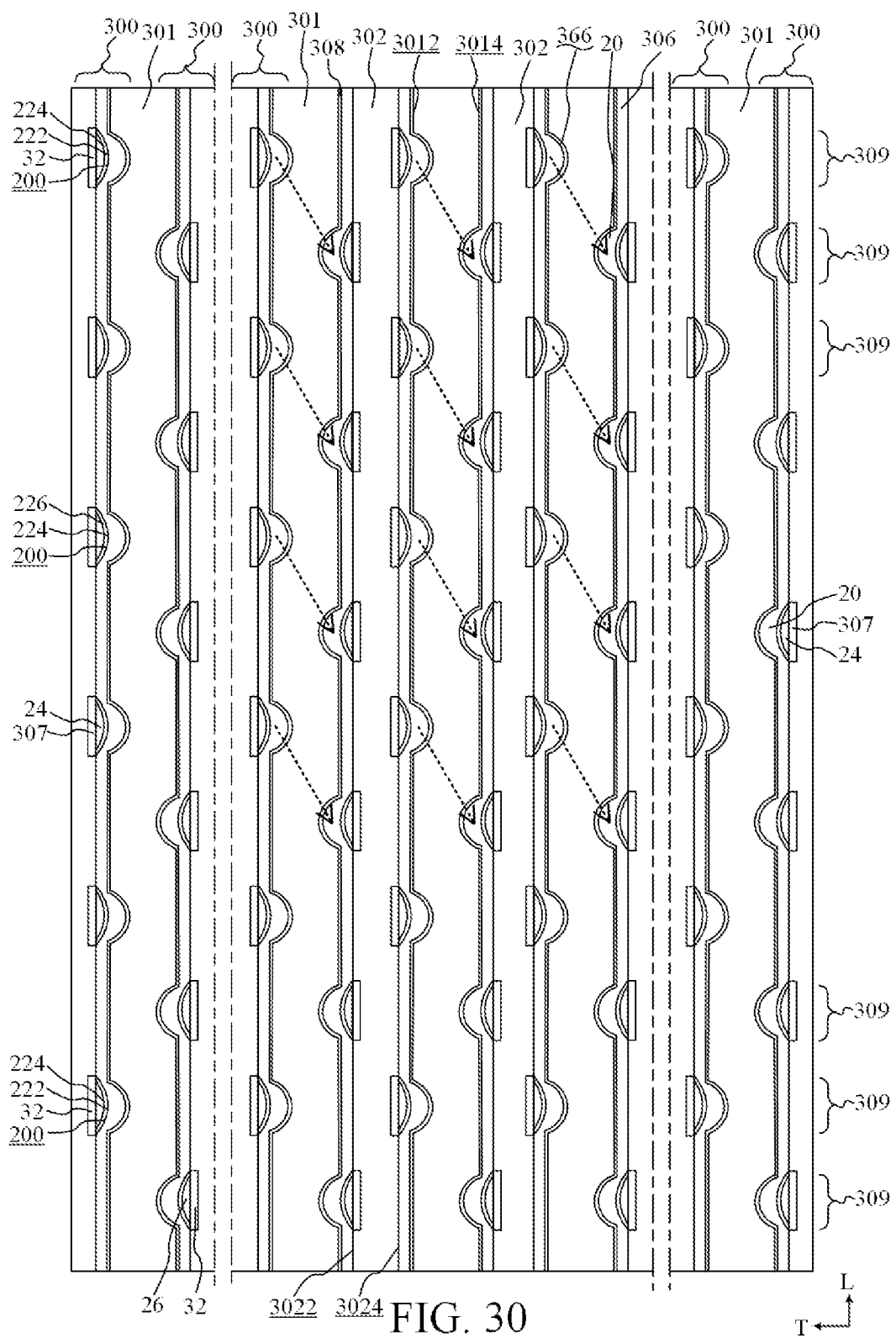
FIG. 30 is a local view of a modification of the three dimensional memory device according to the invention.
Figure 31:
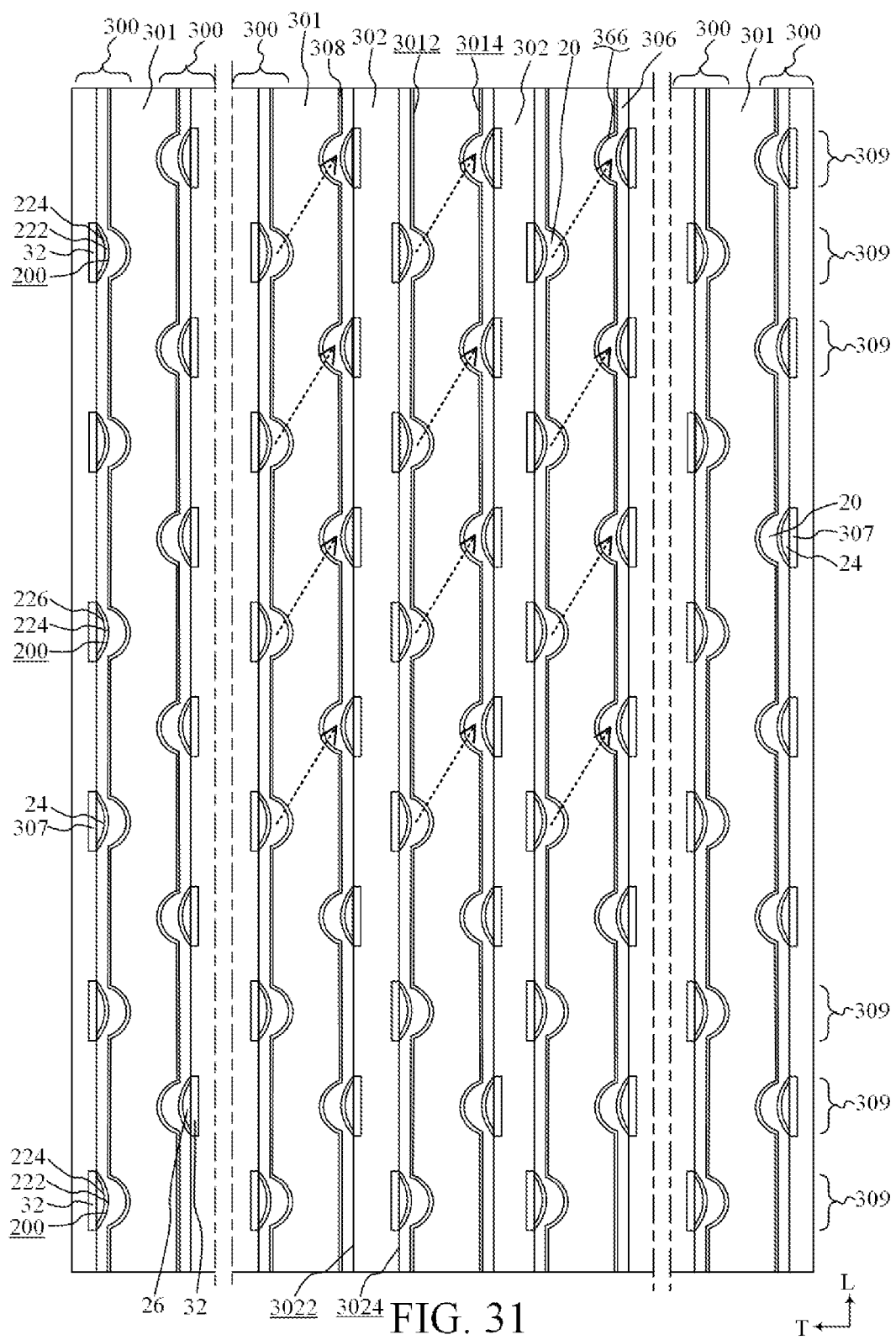
FIG. 31 is a local view of another modification of the three dimensional memory device according to the invention.
Figure 32:
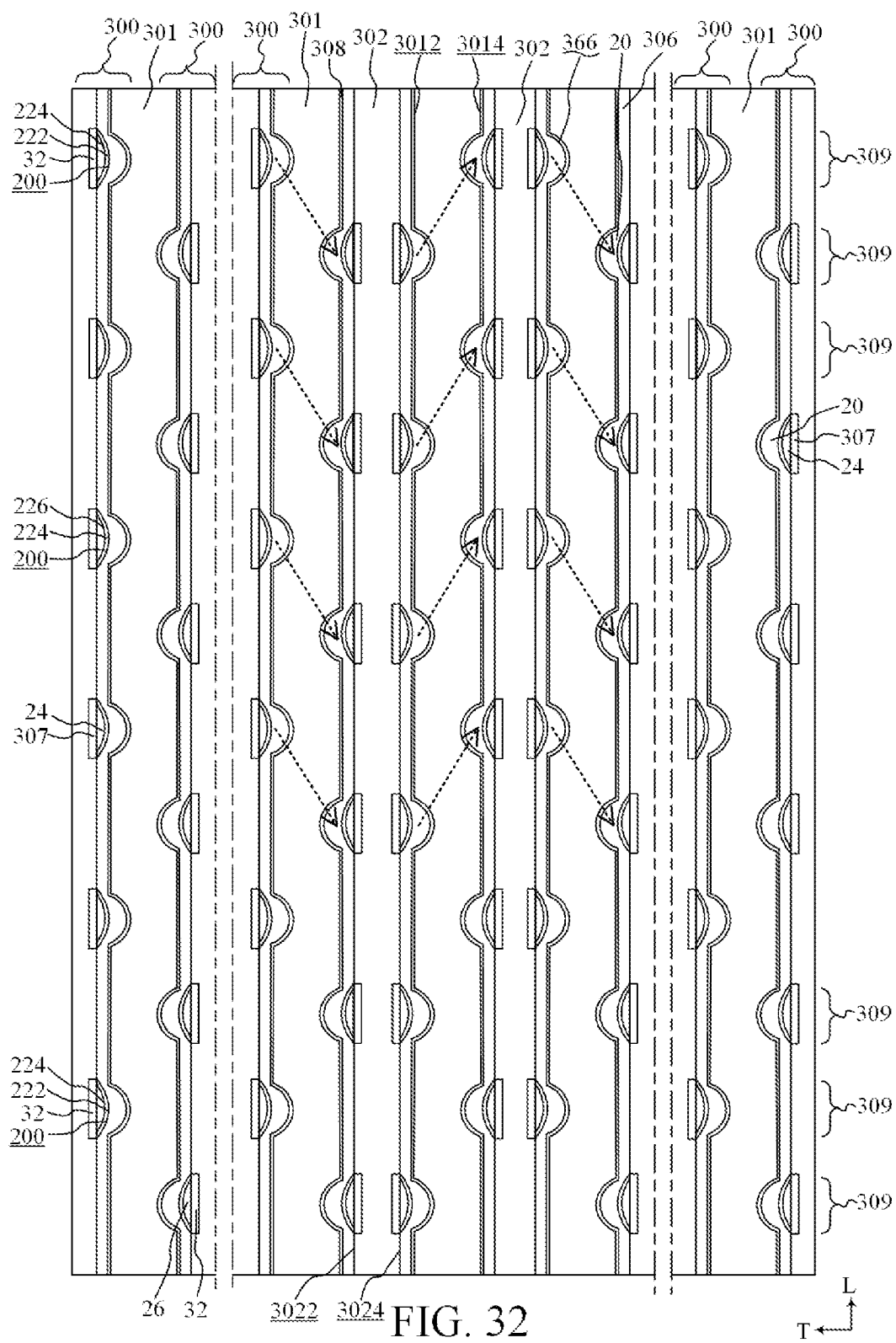
FIG. 32 is a local view of another modification of the three dimensional memory device according to the invention.

Referring to FIG. 30, FIG. 31 and FIG. 32, and referring to FIG. 28 again, FIG. 30 is a local to view of a modification of the three dimensional memory device 3 according to the invention. FIG. 31 is a local to view of another modification of the three dimensional memory device 3 according to the invention. FIG. 32 is a local to view of another modification of the three dimensional memory device 3 according to the invention.

As shown in FIG. 28, FIG. 30, FIG. 31 and FIG. 32, the dashed arrows in those figures represent the directions of the memory cells 305 (or the first selection transistors 303, or the second selection transistors 304) arranged on the first longitudinal edge 3012 of each of the first isolation stripes 301 mapping the memory cells 305 (or the first selection transistors 303, or the second selection transistors 304) on the second longitudinal edge 3014 of said one first isolation stripe 301.

The directions of the dotted arrows indicated on the adjacent first isolation stripes 301 shown in FIG. 28, FIG. 30, FIG. 31 and FIG. 32 have different combinations. That is, for the three dimensional memory device 3 according to the preferred embodiment of the invention, the symmetry of the memory cells 303 (or the first selection transistors 303, or the second selection transistors 304) arranged on the first longitudinal edges 3012 and the second longitudinal edges 3014 of the adjacent first isolation stripes 301 has various combinations as shown in FIG. 28, FIG. 30, FIG. 31, and FIG. 32. The three dimensional memory devices 3 shown in FIG. 30, FIG. 31 and FIG. 32 also have all of the structural features of the three dimensional memory device shown in FIG. 28. The components and structures in FIGS. 30 to 32 identical to those shown in FIG. 28 are given the same numerical notations, and will be not described in detail herein.

With detailed description of the invention above, it is clear that in the horizontal current type FanFET according to the invention, the pillar of the semiconductor material extends in the normal direction of the semiconductor substrate, and the first elongated portion of the source region and the second elongated portion of the drain region are oppositely arranged front and rear in the pillar of the semiconductor material. Moreover, the three dimensional memory device, constituted by a plurality of horizontal current type FanFETs according to the invention, can enhance cell density thereof, and has horizontal current flow.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A transistor, comprising:
a pillar of a semiconductor material, extending in a normal direction of a semiconductor substrate and having a base side face parallel to the normal direction, a tapered side face opposite to the base side face, a first top face perpendicular to the normal direction, a bottom face opposite to the first top face, a front side face adjacent to the base side face and the tapered side face, and a rear side face opposite to the front side face, in the pillar, a first elongated portion sandwiched among the base side face, the front side face, the bottom face and the first top face forming a source region, a second elongated portion sandwiched among the base side face, the rear side face, the bottom face and the first top face forming a drain region, a plate portion on the base side face and between the first elongated portion, the second elongated portion forming a channel region, and other portion of the pillar to form a body region;
a gate dielectric layer, formed to overlay the base side face of the pillar of the semiconductor material; and
a gate conductor, formed to overlay the gate dielectric layer.

2. The transistor of claim 1, wherein the base side face is planar, convex or concave.

3. The transistor of claim 2, wherein a combination of the first top face of the pillar of the semiconductor material, a second top face of the gate dielectric layer and a third top face of the gate conductor exhibits one selected from the group consisting of a semi-ellipse, a semi-circle, a triangle, a finger-like shape and a trapezoid.

4. A three dimensional memory device, comprising:
a plurality of spaced memory cell layers, formed on a semiconductor substrate defining a normal direction and a longitudinal direction, each memory cell layer defining a plurality of columns and a plurality of rows and comprising:
a plurality of first isolation stripes extending in the longitudinal direction;
a plurality of second isolation stripes extending in the longitudinal direction, the first isolation stripes and the second isolation stripes being alternatingly arranged, each first isolation stripe having a respective first longitudinal edge and a respective second longitudinal edge, each second isolation stripe having a respective third longitudinal edge and a respective fourth longitudinal edge, wherein a plurality of recesses are formed between the first isolation stripes and the second isolation stripes and face the third longitudinal side walls or the fourth longitudinal side walls of the second isolation stripes, the recesses at one side of each first isolation stripe and the recesses at the other side of said one first isolation stripe are staggeredly arranged, each recess corresponds to one of the columns and to one of the rows;
a plurality of first select transistors, arranged in at least two first end rows among the plurality of rows;
a plurality of second select transistors, arranged in at least two second end rows among the plurality of rows;
a plurality of memory cells, arranged in the rows between said first select transistors and said second select transistors, each of said first select transistors, said second select transistors and said memory cells corresponding to one of the recesses and comprising a pillar of a semiconductor material, each pillar of the semiconductor material being fitted in the corresponding recess and extending in the normal direction and having a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face, a respective first elongated portion sandwiched among the base side face, the front side face, the bottom face and the first top face to form a respective source region, a respective second elongated portion sandwiched among the base side face, the rear side face, the bottom face and the first top face to form a respective drain region, a respective plate portion on the base side face and between the first elongated portion, the second elongated portion to form a respective channel region, and other portion of said one pillar to form a respective body region, each of said first select transistors and said second select transistors also comprising a respective first gate oxide film overlaying the base side face of the corresponding pillar of the semiconductor material, a respective second gate oxide film overlaying the first gate oxide film, and a respective select gate conductor overlaying the second gate oxide film, each memory cell also comprising the respective second gate oxide film overlaying the base side face of the corresponding pillar of the semiconductor material, a respective gate dielectric multi-layered film overlaying the second gate oxide film, and the respective memory gate conductor overlaying the gate dielectric multi-layered film;

a plurality of bit line conductors which each corresponds to one of the columns and connects the pillars of the semiconductor material of the first select transistors, the second select transistors and the memory cells along the corresponding column; and a plurality of word line conductors, extending in the normal direction, each word line conductor connecting the vertically aligned memory gate conductors of the memory cells of the spaced memory cell layers; and a plurality of select gate line conductors, extending in the normal direction, each select gate line conductor connecting the vertically aligned select gate conductors of the first select transistors or the second select transistors of the spaced memory cell layers, wherein each word line conductor and each select gate line conductor are embedded in the adjacent second isolation stripe.

5. The three dimensional memory device of claim 4, wherein each base side face is planar, convex or concave.

6. The three dimensional memory device of claim 5, wherein in each memory cell, a combination of the first top face of the pillar of the semiconductor material, a second top face of the second gate oxide film, a third top face of the gate dielectric multi-layered film and a fourth top face of the memory gate conductor exhibits one selected from the group consisting of a semi-ellipse, a semi-circle, a triangle, a finger-like shape and a trapezoid.

7. The three dimensional memory device of claim 6, wherein each memory cell layer has an area density equal to or less than 2 times a square of a process feature size, per cell.

8. A method of fabrication a three dimensional memory device, comprising the steps of:
forming a plurality of semiconductor layers and a plurality of spacing insulating layers on a semiconductor substrate defining a normal direction and a longitudinal direction, wherein the semiconductor layers and the spacing insulating layers are alternately arranged, the plurality of semiconductor layers define a plurality of spaced active layers;
forming a plurality of first trenches parallel to the longitudinal direction and being through the semiconductor layers and the spacing insulating layers, wherein each first trench has a respective first longitudinal side wall, a respective second longitudinal side wall and a plurality of protrusions protruding inwardly, the protrusions on the first longitudinal side wall and the protrusions on the second longitudinal side wall are staggeredly arranged;
forming a plurality of first isolation stripes which each is filled in one of the first trenches such that a plurality of stacked stripes of the semiconductor layers and the spacing insulating layers and the first isolation stripes are alternately arranged;
forming a plurality of second trenches parallel to the longitudinal direction, wherein each second trench is formed on a portion of one of the stacked stripes and through the semiconductor layers and the spacing insulating layers, and has a respective third longitudinal side wall and a respective fourth longitudinal side wall;
removing a plurality of first retained portions of the semiconductor layers, which each corresponds to one of the protrusions, such that a plurality of recesses are formed on the third longitudinal side wall and the fourth longitudinal side wall at each active layer, the recesses at one side of each first isolation stripe and the recesses at the other side of said one first isolation stripe are staggeredly arranged;
forming a plurality of pillars of a semiconductor material and a plurality of bit line conductors, wherein the pillars of the semiconductor material at each active layer are arranged in a plurality of columns and a plurality of rows, each pillar of the semiconductor material is fitted in one of the recesses and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face, a respective first elongated portion sandwiched among the base side face, the front side face, the bottom face and the first top face to form a respective source region, a respective second elongated portion sandwiched among the base side face, the rear side face, the bottom face and the first top face to form a respective drain region, a respective plate portion on the base side face and between the first elongated portion, the second elongated portion to form a respective channel region, and other portion of the pillar of the semiconductor material to form a respective body region, each bit line conductor corresponds to one of the columns and connects the pillars along the corresponding column;
forming a plurality of first gate oxide films which each overlays the base side face of one of the pillars of the semiconductor material arranged in at least two first end rows and at least two second end rows among the plurality of rows;
forming a plurality of second gate oxide films which each overlays the base side face of one of the pillars of the semiconductor material arranged in the rows between said at least two first end rows and said at least two second end rows or one of the first gate oxide films;
forming a plurality of gate dielectric multi-layered films which each overlays one of the second gate oxide films overlaying the base side faces of the pillars of the semiconductor material arranged in the rows between said at least two first end rows and said at least two second end rows;

forming a plurality of conductor layers which each overlays one of the third longitudinal side wall and the fourth longitudinal side wall of one of the second trenches;

partially etching the conductor layers to form a plurality of memory gate conductors, a plurality of word line conductors, a plurality of select gate conductors and a plurality of select gate line conductors, wherein each select gate conductor overlays one of the second gate oxide films, each memory gate conductor overlays one of the gate dielectric multi-layered films, each word line conductor extends in the normal direction and connects the vertically aligned memory gate conductors arranged in the rows between said at least two first end rows and said at least two second end rows at all of the active layers, each select gate line conductor extends in the normal direction and connects the vertically aligned select gate conductors arranged in said at least two first end rows and said at least two second end rows at all of the active layers; and forming a plurality of second isolation stripes which each is filled in one of the second trenches.

9. The method of claim 8, wherein in the step of removing the first retained portions of the semiconductor layers, a plurality of second retained portions of the spacing insulating layers form a plurality of spacers which each locates between two vertically neighboring recesses.

10. The method of claim 9, wherein each base side face is planar, convex or concave.

11. The method of claim 10, wherein a combination of the first top face of one of the pillars of the semiconductor material arranged in the rows between said at least two first end rows and said at least two second end rows, a second top face of the second gate oxide film overlaying the base side face of said one pillar, a third top face of the gate dielectric multi-layered film overlaying said one second gate oxide film and a fourth top face of the memory gate conductor overlaying said one gate dielectric multi-layered film exhibits one selected from the group consisting of a semi-ellipse, a semi-circle, a triangle, a finger-like shape and a trapezoid.

* * * * *